United States Patent
Kamo et al.

(10) Patent No.: US 11,459,462 B2
(45) Date of Patent: *Oct. 4, 2022

(54) CHARGE-TRANSPORT MATERIAL AND UTILIZATION THEREOF

(71) Applicant: HITACHI CHEMICAL COMPANY, LTD., Tokyo (JP)

(72) Inventors: Kazuyuki Kamo, Tsukuba (JP); Naoki Asano, Tsukuba (JP); Hiroshi Takaira, Hitachinaka (JP); Iori Fukushima, Tsukuba (JP); Shigeaki Funyuu, Tsuchiura (JP)

(73) Assignee: SHOWA DENKO MATERIALS CO., LTD., Tokyo (JP)

( * ) Notice: Subject to any disclaimer, the term of this patent is extended or adjusted under 35 U.S.C. 154(b) by 476 days.

This patent is subject to a terminal disclaimer.

(21) Appl. No.: 16/484,253

(22) PCT Filed: Jan. 29, 2018

(86) PCT No.: PCT/JP2018/002760
§ 371 (c)(1),
(2) Date: Aug. 7, 2019

(87) PCT Pub. No.: WO2018/147114
PCT Pub. Date: Aug. 16, 2018

(65) Prior Publication Data
US 2019/0382584 A1    Dec. 19, 2019

(30) Foreign Application Priority Data
Feb. 8, 2017    (JP) .............................. JP2017-021375

(51) Int. Cl.
| | | |
|---|---|---|
| *C08L 101/12* | (2006.01) | |
| *H01L 51/50* | (2006.01) | |
| *C08G 61/12* | (2006.01) | |
| *H01L 51/00* | (2006.01) | |
| *C08L 101/06* | (2006.01) | |

(52) U.S. Cl.
CPC ............ *C08L 101/12* (2013.01); *C08G 61/12* (2013.01); *C08L 101/06* (2013.01); *H01L 51/0035* (2013.01); *H01L 51/506* (2013.01); *H01L 51/5056* (2013.01); *C08G 2261/411* (2013.01); *C08G 2261/512* (2013.01); *C08G 2261/95* (2013.01)

(58) Field of Classification Search
CPC ...... C08G 73/026; C09K 11/06; H01B 1/128; H05B 33/14; H01L 51/0043
See application file for complete search history.

(56) References Cited

U.S. PATENT DOCUMENTS

2008/0233429 A1    9/2008 Oguma et al.

FOREIGN PATENT DOCUMENTS

| | | |
|---|---|---|
| JP | 2000-036390 A | 2/2000 |
| JP | 2003-213002 A | 7/2003 |
| JP | 2005-075948 A | 3/2005 |
| JP | 2006-279007 A | 10/2006 |
| JP | 2011-223015 A | 11/2011 |
| JP | 2013-023491 A | 2/2013 |
| JP | 2013-131573 A | 7/2013 |
| JP | 2017-069324 A | 4/2017 |
| JP | 2017-079309 A | 4/2017 |
| JP | 2017-135179 A | 8/2017 |
| TW | 200530373 A | 9/2005 |
| WO | 2010/140553 A1 | 12/2010 |
| WO | 2017/188023 A1 | 11/2017 |

OTHER PUBLICATIONS

Endo, A., Ogasawara, M., Takahashi, A., Yokoyama, D., Kato, Y. and Adachi, C. (2009), Thermally Activated Delayed Fluorescence from Sn4+-Porphyrin Complexes and Their Application to Organic Light Emitting Diodes—A Novel Mechanism for Electroluminescence. Adv. Mater., 21: 4802-4806. doi:10.1002/adma.200900983 (cited in specification).

Endo, A., Sato, K., Yoshimura, K., Kai, T., Kawada, A., et al. (2011) Efficient up-conversion of triplet excitons into a singlet state and its application for organic light emitting diodes. Appl. Phys. Lett. 98, 083302 ; doi: 10.1063/1.3558906 (cited in specification).

Nakagawa, T., Ku, S., Wong, K., Adachi, C. Electroluminescence based on thermally activated delayed fluorescence generated by a spirobifluorene donor-acceptor structure Chem. Commun., 2012,48, 9580-9582 (cited in specification).

Lee, S., Yasuda, T., Nomura, H., and Adachi, C. High-efficiency organic light-emitting diodes utilizing thermally activated delayed fluorescence from triazine-based donor-acceptor hybrid molecules Appl. Phys. Lett. 101, 093306 (2012); doi: 10.1063/1.4749285 (cited in specification).

Zhang, Q., Li, J., Shizu, K,. Huang, S., Hirata, S., Miyazaki, H., and Adachi, C. Design of Efficient Thermally Activated Delayed Fluorescence Materials for Pure Blue Organic Light Emitting Diodes. J. Am. Chem. Soc., 134, 14706 (2012) (cited in specification).

Tanaka, H., Shizu, K., Miyazakiab, H., and Adachi, C. Efficient green thermally activated delayed fluorescence (TADF) from a phenoxazine-triphenyltriazine (PXZ-TRZ) derivative. Chem. Comm., 48, 11392 (2012) (cited in specification).

Uoyama, H., Goushi, K., Shizu, K., Nomura, H., and Adachi, C. Highly efficient organic light-emitting diodes from delayed fluorescence Nature, 492, 234 (2012) (cited in specification).

(Continued)

Primary Examiner — Shane Fang

(74) Attorney, Agent, or Firm — Fitch, Even, Tabin & Flannery, LLP

(57) ABSTRACT

A charge transport material containing a charge transport polymer that satisfies at least one of (I) or (II) described below: (I) to independently have both a monovalent substituent having an alicyclic structure of 7 or more carbon atoms, and a monovalent substituent having a carbonyl-containing group; and (II) to have a monovalent substituent that includes a monovalent substituent having an alicyclic structure of 7 or more carbon atoms bonded directly to a carbonyl-containing group.

17 Claims, 1 Drawing Sheet

(56) References Cited

OTHER PUBLICATIONS

Li, J., Nakagawa, T., MacDonald, J., Zhang, Q., Nomura, H., Miyazaki, H., and Adachi, C. Highly Efficient Organic Light-Emitting Diode Based on a Hidden Thermally Activated Delayed Fluorescence Channel in a Heptazine Derivative. Adv. Mater., 25, 3319 (2013) (cited in specification).
Ishimatsu, R., Matsunami, S., Shizu, K., Adachi, C., Nakano, K., and Imato, T. Solvent Effect on Thermally Activated Delayed Fluorescence by 1,2,3,5-Tetrakis(carbazol-9-yl)-4,6-dicyanobenzene J. Phys. Chem. A, 117, 5607 (2013) (cited in specification).
Serevicius, T., Nakagawa, T., Kuo, M., Cheng, S., Wong, K., Chang, C., Kwong, R. C., Xiae, S., and Adachi, C. Enhanced electroluminescence based on thermally activated delayed fluorescence from a carbazole-triazine derivative. Phys. Chem. Chem. Phys., 15, 15850 (2013) (cited in specification).
Nasu, K., Nakagawa, T., Nomura, H., Lin, C., Cheng, C., Tseng, M., Yasudaad, T., and Adachi, C. A highly uminescent spiro-anthracenone-based organic light-emitting diode exhibiting thermally activated delayed fluorescence Chem. Comm., 49, 10385 (2013) (cited in specification).
Li, B., Nomura, H., Miyazaki, H., Zhang, Q., Yoshida, K., Suzuma, Y., Orita, A., Otera, J., Adachi, C. Dicarbazolyldicyanobenzenes as Thermally Activated Delayed Fluorescence Emitters: Effect of Substitution Position on Photoluminescent and Electroluminescent Properties. Chem. Lett., 43, 319 (2014) (cited in specification).
"Wettability and Super Water Repellency, Super Hydrophilicity Technology, and the Control thereof", Technical Information Institute Co., Ltd., 2007, Chapter 3 (cited in specification).

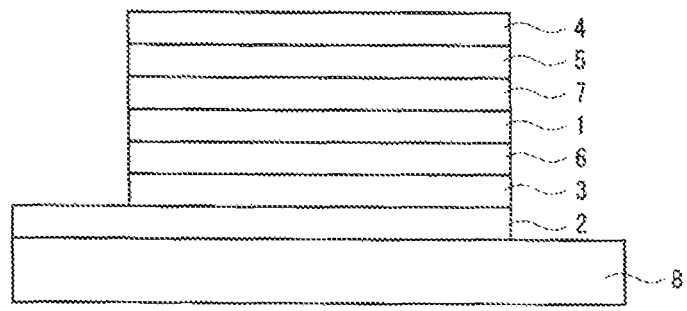

CHARGE-TRANSPORT MATERIAL AND UTILIZATION THEREOF

CROSS-REFERENCE TO RELATED APPLICATIONS

This application is a U.S. national phase application filed under 35 U.S.C. § 371 of International Application No. PCT/JP2018/002760, filed Jan. 29, 2018, designating the United States, which claims priority from Japanese Patent Application No. 2017-021375, filed Feb. 8, 2017, which are hereby incorporated herein by reference in their entirety.

TECHNICAL FIELD

The present invention relates to a charge transport material, and an ink composition containing the material. Further, the present invention also relates to an organic electronic element, an organic electroluminescent element, a display element, an illumination device and a display device that each have an organic film formed using the charge transport material or the ink composition.

BACKGROUND ART

Organic electronic elements are elements which use an organic substance to perform an electrical operation, and because they are expected to be capable of providing advantages such as low energy consumption, low prices and superior flexibility, they are attracting considerable attention as a potential alternative technology to conventional inorganic semiconductors containing mainly silicon.

Examples of organic electronic elements include organic electroluminescent elements (hereafter also referred to as "organic EL elements"), organic photoelectric conversion elements, and organic transistors and the like.

Among organic electronic elements, organic EL elements are attracting attention for potential use in large-surface area solid state lighting source applications to replace incandescent lamps or gas-filled lamps or the like. Further, organic EL elements are also attracting attention as the leading self-luminous display for replacing liquid crystal displays (LCD) in the field of flat panel displays (FPD), and commercial products are becoming increasingly available.

Depending on the organic materials used, organic EL elements are broadly classified into two types: low-molecular weight type organic EL elements and polymer type organic EL elements. In polymer type organic EL elements, polymer materials are used as the organic materials, whereas in low-molecular weight type organic EL elements, low-molecular weight materials are used.

In the case of polymer type organic EL elements, film formation using wet processes such as printing or inkjet application is possible. Accordingly, compared with low-molecular weight type organic EL elements in which film formation is mainly performed in vacuum systems, increases in screen size and cost reductions can be achieved more easily with polymer type organic EL elements, and the application of these polymer type organic EL elements to future large-screen organic EL displays is highly anticipated.

In the field of polymer type organic EL elements, the development of polymer materials that are suited to wet processes is being actively pursued (for example, Patent Document 1). However, organic EL elements containing organic films produced using conventional polymer materials have not been entirely satisfactory in terms of drive voltage, emission efficiency and emission lifespan, and further improvements would be desirable.

One known technique for improving the characteristics of an organic EL element involves using multilayering to achieve functional separation. In the multilayering of organic films by wet processes, an ink that forms the upper layer (hereafter referred to as "the upper layer ink") is applied to an organic film. Accordingly, the organic film must have resistance to the solvent of the upper layer ink (hereafter also referred to as "solvent resistance").

Further, from the viewpoint of improving the characteristics of the various types of organic electronic elements, it is preferable that the organic films have uniform film thickness.

In order to enable formation of an organic film having uniform film thickness, it is thought that the wetting properties of the ink used in forming the organic film are important. When the wetting properties of the ink are poor, the film thickness of the dried organic film tends to lack uniformity within the plane, making it difficult to achieve the desired characteristics. For example, in an organic EL element, achieving uniform light emission becomes difficult, and therefore improvements are required.

For this reason, various methods for improving the wetting properties are being investigated. For example, one known method involves preparing the ink using a solvent having a low surface tension (for example, Patent Document 2). Further, a method in which the surface of the lower layer to which the ink is applied (hereafter referred to as "the lower layer") is subjected to a surface treatment is also known (for example, Non-Patent Document 1).

PRIOR ART DOCUMENTS

Patent Documents

Patent Document 1: JP 2006-279007 A
Patent Document 2: JP 2013-131573 A

Non-Patent Document

Non-Patent Document 1: "Wettability and Super Water Repellency, Super Hydrophilicity Technology. and the Control thereof". Technical Information Institute Co., Ltd., 2007. Chapter 3

DISCLOSURE OF INVENTION

Problems Invention Aims to Solve

However, when performing multilayering of organic films using wet processes, in the case of methods that improve the wetting properties via the action of the solvent use in forming the ink, the solvent not only requires a low surface tension, but must also be selected with due consideration of process compatibility factors such as the solubility of the other components (film materials) that constitute the ink and the dischargeability, and there is still room for improvement in terms of satisfying all of these requirements.

Further, in the case of methods in which the lower layer is subjected to a surface treatment, because the surface treatment of the organic film that acts as the lower layer must be repeated as the degree of multilayering of the organic films is increased, a problem arises in that the surface treatment can cause a deterioration in the inherent properties of the organic films such as the charge transport properties.

As outlined above, there has been considerable demand for a simpler method for improving both the ink wettability of the lower layer, and the wettability of the organic film formed from that ink by the upper layer ink.

Accordingly, in light of the above circumstances, the present invention aims to provide a charge transport material containing a charge transport polymer which, during film formation by a wet process, has excellent wettability of the lower layer and can also form an organic film that exhibits excellent wettability by the upper layer ink, as well as providing an ink composition that contains the charge transport material. Further, the present invention also provides an organic electronic element, an organic EL element, a display element, an illumination device and a display device having an organic film of uniform film thickness formed using the above charge transport material or ink composition.

Means for Solution of the Problems

As a result of intensive investigation, the inventors of the present invention discovered that a charge transport polymer having an alicyclic structure of 7 or more carbon atoms and a carbonyl-containing group had excellent wettability of the lower layer and could also form an organic film that exhibits excellent wettability by the upper layer ink. Further, they also discovered that excellent wettability could be achieved when performing film formation on hydrophilic electrodes of ITO or the like.

Embodiments of the present invention relate to the aspects described below. However, the present invention is not limited to the following embodiments, and includes a variety of embodiments.

One embodiment relates to a charge transport material containing a charge transport polymer, wherein the charge transport polymer satisfies at least one of (I) or (II) described below:

(I) to independently have both a monovalent substituent having an alicyclic structure of 7 or more carbon atoms, and a monovalent substituent having a carbonyl-containing group;

(II) to have a monovalent substituent that includes a monovalent substituent having an alicyclic structure of 7 or more carbon atoms bonded directly to a carbonyl-containing group.

In (I) and (II) described above, each of the monovalent substituents preferably exists on at least one terminal of the above charge transport polymer.

Further, in (I) and (II) described above, each of the monovalent substituents having an alicyclic structure of 7 or more carbon atoms is preferably a cycloalkyl group of 7 to 20 carbon atoms.

Furthermore, in (I) and (II) described above, each of the carbonyl-containing groups preferably contains at least one type of divalent linking group represented by any of formulas (a) to (i) shown below.

[Chemical formula 1]

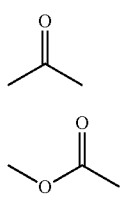

(a)

(b)

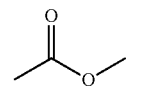

(c)

(d)

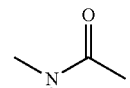

(e)

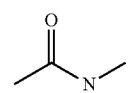

(f)

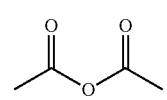

(g)

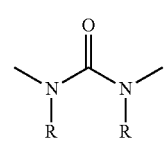

(h)

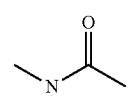

(i)

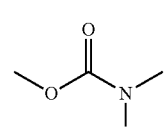

[In the formulas, R represents a hydrogen atom or an alkyl group of 1 to 12 carbon atoms (but excludes cyclic alkyl groups of 7 or more carbon atoms).]

The charge transport polymer of the above charge transport material preferably satisfies (II) described above.

The charge transport polymer of the above charge transport material preferably contains a divalent structural unit having charge transport properties and a trivalent or higher valent structural unit having charge transport properties.

The charge transport polymer of the above charge transport material preferably has a structural unit containing at least one type of structure selected from the group consisting of aromatic amine structures, carbazole structures, thiophene structures, fluorene structures, benzene structures and pyrrole structures.

The charge transport polymer of the above charge transport material preferably has at least one polymerizable functional group.

The above charge transport material is preferably used as a hole injection layer material.

Another embodiment relates to an ink composition containing the charge transport material of the embodiment described above and a solvent.

Another embodiment relates to an organic electronic element having an organic film formed using the charge transport material of the embodiment described above or the ink composition of the embodiment described above.

Another embodiment relates to an organic electroluminescent element having an organic film formed using the charge transport material of the embodiment described above or the ink composition of the embodiment described above.

The above organic electroluminescent element preferably also has a flexible substrate.

The flexible substrate of the above organic electroluminescent element preferably contains a resin film.

Another embodiment relates to a display element provided with the organic electroluminescent element of the embodiment described above.

Another embodiment relates to an illumination device provided with the organic electroluminescent element of the embodiment described above.

Another embodiment relates to a display device provided with the illumination device of the embodiment described above, and a liquid crystal element as a display unit.

Effects of the Invention

The present invention is able to provide a charge transport material containing a charge transport polymer which, during organic film multilayering using a wet process, has excellent wettability of the lower layer and can also form an organic film that exhibits excellent wettability by an upper layer ink, as well as an ink composition that contains the charge transport material. Further, by using the above charge transport material or the above ink composition, the present invention can also provide an organic electronic element and an organic EL element having an organic film of uniform film thickness, and a display element, an illumination device and a display device that use the organic EL element.

This Application is related to the subject matter disclosed in prior Japanese Application 2017-021375, filed on Feb. 8, 2017, the entire contents of which are incorporated by reference herein.

BRIEF DESCRIPTION OF THE DRAWINGS

The FIGURE is a schematic cross-sectional view illustrating one embodiment of an organic EL element.

EMBODIMENTS FOR CARRYING OUT THE INVENTION

Embodiments of the present invention are described below, but the present invention is not limited to the following embodiments.

<Charge Transport Material>

In one embodiment, the charge transport material contains a specific charge transport polymer described below. The charge transport material may contain two or more types of this specific charge transport polymer, and may also contain one or more other charge transport polymers.

[Charge Transport Polymer]

In one embodiment, the charge transport polymer has at least one type of structural unit having charge transport properties, and the charge transport polymer has an alicyclic structure of 7 or more carbon atoms and a carbonyl-containing group. Specifically, the charge transport polymer satisfies at least one of (I) or (II) described below:

(I) to independently have both a monovalent substituent having an alicyclic structure of 7 or more carbon atoms, and a monovalent substituent having a carbonyl-containing group;

(II) to have a monovalent substituent that includes a monovalent substituent having an alicyclic structure of 7 or more carbon atoms bonded directly to a carbonyl-containing group.

When a charge transport material containing the charge transport polymer described above is used to prepare an ink composition, which is then used to form an organic film by a wet process, the ink wettability of the lower layer is favorable. Further, when an upper layer ink is applied to the organic film formed using the above ink, excellent wettability can be obtained. In other words, by using the charge transport polymer described above, the wetting properties can be improved both when applying the ink to a lower layer and when applying an upper layer ink to the obtained organic film, and therefore a multilayer organic film having uniform film thickness can be obtained with ease.

First is a description of the embodiment that satisfies (1) above. In (1), the monovalent substituent (A) having an alicyclic structure of 7 or more carbon atoms is as described below.

[Monovalent Substituent (A) Having an Alicyclic Structure of 7 or More Carbon Atoms]

The monovalent substituent (A) having an alicyclic structure of 7 or more carbon atoms (hereafter referred to as "the substituent (A)") contains a monovalent substituent having a structure in which one hydrogen atom has been removed from a saturated or unsaturated alicyclic compound in which the number of carbon atoms constituting the ring is 7 or more. In the alicyclic compound, some of the hydrogen atoms bonded to the carbon atoms that constitute the ring may each be substituted with an organic group R (provided the organic group R does not include a carbonyl-containing group described below). Examples of the organic group R include an alkyl group, an amino group, and a hydroxyl group or the like. The alkyl group is preferably linear or branched. The number of carbon atoms in the alkyl group is preferably from 1 to 12, more preferably from 1 to 8, and even more preferably from 1 to 4.

In the above substituent (A), the number of carbon atoms constituting the ring of the alicyclic structure is preferably from 7 to 20, more preferably from 7 to 16, and even more preferably from 7 to 12. When the number of carbon atoms constituting the ring of the alicyclic structure satisfies this range, the alicyclic structure is thermally stable, and the wettability by the upper layer ink can be further improved. The above number of carbon atoms means only the carbons that constitute the ring, and does not include any carbon atoms in the aforementioned organic group R (the substituent).

In the above substituent (A), the alicyclic structure may be a monocyclic structure or a polycyclic structure. In those cases where the alicyclic structure is a polycyclic structure, the structure is preferably bicyclic or tricyclic.

In one embodiment, the substituent (A) is preferably a monovalent substituent (A1) (hereafter referred to as "the substituent (A1)") having a structure in which one hydrogen atom has been removed from a carbon atom that constitutes the ring of an aforementioned alicyclic compound. More specifically, the substituent (A1) is preferably at least one type of substituent selected from the group consisting of cycloalkyl groups, cycloalkenyl groups and cycloalkynyl groups in which the number of carbon atoms constituting the ring is from 7 to 20. The substituent (A1) may have a structure in which at least one hydrogen atom bonded to a carbon atom constituting the ring has been substituted with an aforementioned organic group R.

Specific examples of the substituent (A1) are as follows.

The cycloalkyl groups are monovalent groups derived from cycloalkanes such as cycloheptane, cyclooctane, cyclononane, cyclodecane, cycloundecane, cyclododecane, bicycloundecane, decahydronaphthalene, norcarane (bicyclo-[4.1.0]-heptane), norbornane (bicyclo-[2.2.1]-heptane), bicyclo-[2.2.2]-octane, bicyclo-[3.3.0]-octane, bicyclo-[4.3.0]-nonane, tetrahydrodicyclopentadiene (tricyclo [5.2.1.0$^{2,6}$]decane, adamantane (tricyclo[3.3.1.1$^{3,7}$]decane), and twistane (tricyclo[4.4.0.0$^{3,8}$]decane).

The cycloalkenyl groups are monovalent groups derived from cycloalkenes such as cycloheptene, cyclohexadienes (such as 1,3-cyclohexadiene and 1,4-cyclohexadiene), cyclooctadienes (such as 1,5-cyclooctadiene), cycloheptatriene, cyclooctatriene, cyclododecatriene, norbornene, and norbornadiene.

The cycloalkynyl groups are monovalent groups derived from cycloalkynes such as cyclooctyne.

Among the various possibilities, the substituent (A1) is preferably a cycloalkyl group of 7 to 20 carbon atoms. The number of carbon atoms is more preferably from 7 to 16, and even more preferably from 7 to 12. Although the cycloalkyl group may have either a monocyclic structure or a polycyclic structure, from the viewpoint of improving the heat resistance, a group having a polycyclic structure is preferred. The cycloalkyl group having a polycyclic structure may have a crosslinked structure. From this type of viewpoint, among the various cycloalkyl groups of 7 to 20 carbon atoms, a monovalent group derived from a cycloalkane having a polycyclic crosslinked structure such as tetrahydrodicyclopentadiene or adamantane is particularly preferred.

[Monovalent Substituent (C) Having a Carbonyl-Containing Group]

In the charge transport polymer that satisfies (I) above, the monovalent substituent (C) (hereafter referred to as "the substituent (C)") having a carbonyl-containing group exists independently of the above substituent (A) within the molecule of the charge transport polymer. In this embodiment, the substituent (C) is represented by a general formula "—X—R1". In this formula, X represents a carbonyl-containing group. R1 is a monovalent organic group other than the monovalent substituent (A) having an alicyclic structure of 7 or more carbon atoms described above. For example, the organic group R1 may be a linear or branched alkyl group of 1 to 22 carbon atoms.

[Carbonyl-Containing Group]

The carbonyl-containing group means a divalent linking group containing at least a carbonyl group (C=O). More specifically, the substituent (C) is preferably a monovalent substituent (C1) (hereafter referred to as "the substituent (C1)") containing at least one type of divalent linking group represented by any of formulas (a) to (i) shown below as X.

[Chemical formula 1]

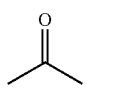

(a)

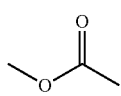

(b)

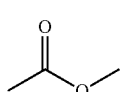

(c)

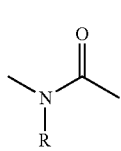

(d)

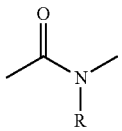

(e)

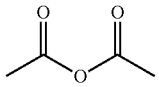

(f)

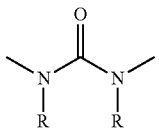

(g)

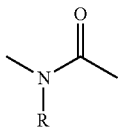

(h)

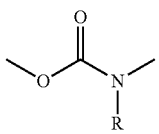

(i)

In the formulas, R represents a hydrogen atom or an alkyl group of 1 to 12 carbon atoms (but excludes cyclic alkyl groups of 7 or more carbon atoms). The alkyl group is preferably linear or branched. In one embodiment, R is preferably an alkyl group of 1 to 8 carbon atoms, and is more preferably a linear alkyl group of 1 to 4 carbon atoms.

In one embodiment, the above substituent (C1) is preferably a substituent represented by the general formula "—X—R1" in which X is represented by formula (c) (an ester linkage), and R1 is a linear or branched alkyl group of 1 to 22 carbon atoms. The number of carbon atoms in the alkyl group is preferably from 1 to 18, more preferably from 1 to 12, and even more preferably from 1 to 8.

Next is a description of the embodiment that satisfies (II) above. A charge transport polymer that satisfies (II) includes a monovalent substituent that contains a monovalent substituent having an alicyclic structure of 7 or more carbon atoms bonded directly to a carbonyl-containing group.

In other words, in this embodiment, the charge transport polymer includes a monovalent substituent represented by a general formula "—X-A". In this formula, X represents a carbonyl-containing group, preferably contains at least one type of divalent linking group represented by any of formulas (a) to (i) shown above, and is more preferably an ester linkage represented by formula (c).

Further, in the above formula, A represents a monovalent substituent having an alicyclic structure of 7 or more carbon atoms, and is the same as the monovalent substituent (A) described in the above embodiment.

In one embodiment, the carbonyl-containing group and the alicyclic structure are preferably bonded together directly. In other words, the charge transport polymer preferably contains a monovalent substituent represented by a general formula "—X-A1", wherein A1 is the same as the monovalent substituent (A1) described above in relation to the embodiment that satisfies (I). In this formula. A1 is preferably a cycloalkyl group of 7 to 20 carbon atoms, and is more preferably a cycloalkyl group having a polycyclic structure.

In one embodiment, the charge transport polymer may satisfy both (I) and (II).

As described above, the charge transport polymer either (I) has both the above substituent (A) and the above substituent (C) existing independently of one another, or (II) has a monovalent substituent (hereafter referred to as "the substituent CA") represented by general formula "—X-A".

Each of the substituents in (I) and (II) may exist in a terminal structural unit constituting the charge transport polymer or in another type of structural unit, and there are no particular limitations on the location in which the substituent is introduced.

In one embodiment, the substituent (A) and the substituent (C), or the substituent (CA), preferably each exist in at least a terminal structural unit constituting the charge transport polymer. In one embodiment, the substituent (A) and the substituent (C) may exist in mutually separate structural units. For example, one of the substituent (A) and the substituent (C) may exist in a terminal structural unit constituting the charge transport polymer, while the other substituent exists in another type of structural unit.

From the viewpoint of the surface free energy described below, the monovalent substituent (A) or the substituent (CA) having the alicyclic structure of 7 or more carbon atoms preferably exists on at least one terminal of the charge transport polymer. The organic group (A) or the substituent (CA) is also preferably introduced as a substituent on a structural unit that constitutes a terminal from the viewpoint of simplifying the synthesis of the monomer compound used in forming the charge transport polymer.

In those cases where multilayering is performed by forming an organic film using a wet process, and then applying an ink for forming an upper layer to that organic film, one factor that affects the wettability by the upper layer ink is the surface free energy of the organic film. Here, the term "organic film" means a dried film or cured film obtained using a polymer. In other words, the "organic film" means either a cured film in the case where the structural units that constitute the polymer have a polymerizable functional group, or a dried film in the case where the structural units do not include a polymerizable functional group. In the present description, cured films and dried films are jointly referred to using the term "organic film" or "film". Further, in the present description, surface free energy is as defined below.

[Surface Free Energy]

As shown by formula (1) below, the surface free energy is represented by the sum of a polar component and a non-polar component based on the Owens-Weldt method.

[Numerical formula 11]

Surface free energy ($\gamma$)=polar component ($\gamma_p$)+non-polar component ($\gamma_d$)     (1)

According to Young's equation, the relationship between the contact angle and the surface free energy can be represented by formula (2) shown below. In this formula, the subscript L indicates a liquid, the subscript S indicates a solid, the subscript SL indicates the solid/liquid interface, and $\theta$ represents the contact angle.

[Numerical formula 2]

$$\gamma_S = \gamma_{LS} + \gamma_L \cos\theta \quad (2)$$

As a result of contact between two substances such as a liquid and a solid, it is postulated that the reduced surface free energies of the substances can be represented by the sum of the geometric means of the corresponding surface free energies, as indicated in formula (3) below. The subscripts p and d indicate the polar component and the non-polar component respectively of the respective surface free energies.

[Numerical formula 3]

$$\gamma_{LS} = \gamma_S + \gamma_L - 2\sqrt{\gamma_{Sp}\gamma_{Lp}} - 2\sqrt{\gamma_{Sd}\gamma_{Ld}} \quad (3)$$

By eliminating $\gamma_{Ls}$ from the above formulas (2) and (3), formula (4) shown below is obtained.

[Numerical formula 4]

$$\gamma_L(1+\cos\theta)/2 = \sqrt{\gamma_{Sp}\gamma_{Lp}} + \sqrt{\gamma_{Sd}\gamma_{Ld}} \quad (4)$$

As is evident from formula (4), by measuring the contact angle of a known solvent, the surface free energy of a film can be calculated. In other words, two different types of liquid droplets of water and diiodomethane are dripped onto the polymer film, and the respective contact angles are measured. Water has a polar component of 51.0 mJ/m² and a non-polar component of 21.8 mJ/m², whereas diiodomethane has a polar component of 1.3 mJ/m² and a non-polar component of 49.5 mJ/m².

Accordingly, by inserting the two contact angles and solving the simultaneous equations, the surface free energy (polar component, non-polar component) of the polymer film can be calculated.

More specifically, the simultaneous equations are represented by formula (5) and formula (6) shown below.

[Numerical formula 5]

$$\gamma_{LM}(1+\cos\theta_M)/2 = (\gamma_{sp}\cdot\gamma_{LpM})^{0.5} + (\gamma_{sd}\cdot\gamma_{LdM})^{0.5} \quad (5)$$

[Numerical formula 6]

$$\gamma_{LW}(1+\cos\theta_W)/2 = (\gamma_{sp}\cdot\gamma_{LpW})^{0.5} + (\gamma_{sd}\cdot\gamma_{LdW})^{0.5} \quad (6)$$

In formula (5) and formula (6):

$\gamma_{LpM}$ represents the polar component of the surface free energy of diiodomethane, $\gamma_{LdM}$ represents the non-polar component of the surface free energy of diiodomethane.

$\gamma_{LM}$ represents the surface free energy of diiodomethane ($=\gamma_{LpM}+\gamma_{LdM}$), $\theta_M$ represents the contact angle of diiodomethane on the polymer film, $\gamma_{LpW}$ represents the polar component of the surface free energy of water, $\gamma_{LdW}$ represents the non-polar component of the surface free energy of water, $\gamma_{LM}$ represents the surface free energy of water ($=\gamma_{LpM}+\gamma_{LdW}$), $\theta_W$ represents the contact angle of water on the polymer film, $\gamma_{sp}$ represents the polar component of the surface free energy of the polymer film, and $\gamma_{sd}$ represents the non-polar component of the surface free energy of the polymer film.

In order to increase the surface free energy, it is necessary to increase one of the polar component and the non-polar component described above. The polar component can be increased by enhancing interactions caused by basic groups, dipole polarization and hydrogen bonding. On the other hand, the non-polar component can be increased by enhancing the crystallinity of the organic film or the density of the organic film.

In one embodiment, from the viewpoint of improving the wettability by inks, the non-polar component of the surface free energy of the organic film is preferably increased.

The inventors of the present invention discovered that when a specific alicyclic structure was introduced into the molecule of a charge transport polymer, the non-polar component of the surface free energy of the organic film increased. It is thought that this is because when, for example, the aforementioned substituent (A) or substituent (CA) is introduced into the charge transport polymer, the substituents having alicyclic structures that exist at the polymer terminals align, resulting in increased organic film crystallinity.

In one embodiment, from the viewpoint of improving the wettability by the upper layer ink, the non-polar component of the surface free energy of the organic film is preferably at least 40 mJ/m$^2$, more preferably at least 41 mJ/m$^2$, and even more preferably 41.5 mJ/m$^2$ or greater.

Further, the sum of the polar component surface free energy and the non-polar component surface free energy is preferably at least 42 mJ/m$^2$, more preferably at least 42.5 mJ/m$^2$, and even more preferably 42.6 mJ/m$^2$ or greater. On the other hand, in one embodiment, the above sum of the polar component surface free energy and the non-polar component surface free energy is preferably not more than 50 mJ/m$^2$, more preferably not more than 49 mJ/m$^2$, and even more preferably 48 mJ/m$^2$ or less.

By introducing an alicyclic structure as the aforementioned substituent (A) or substituent (CA) in the charge transport polymer used as an ink material for forming an organic film, the surface free energy of the organic film can be easily adjusted as appropriate. The substituent (A) or the substituent (CA) may include different types of alicyclic structures.

From the viewpoint of increasing the non-polar component of the surface free energy, the proportion of the substituent (A) or substituent (CA) contained within the charge transport polymer, based on the total of all the structural units, is preferably at least 1 mol %, more preferably at least 2 mol %, and even more preferably 3 mol % or greater. In those cases where the charge transport polymer contains both the substituent (A) and the substituent (CA), the above proportion refers to the total amount of both substituents.

On the other hand, from the viewpoint of ensuring favorable solvent resistance relative to the upper layer ink, the above proportion based on the total of all the structural units is preferably not more than 99.9 mol %, more preferably not more than 99.5 mol %, and even more preferably 99 mol % or less. In the case of a monomer compound containing one of the substituent (A) within the molecule, the above mol % value is calculated as the proportion of the monomer compound containing the substituent (A) relative to the total amount of all the monomer compounds that constitute the polymer. In the case of a monomer compound containing two of the above substituents in the molecule, the mol % value is two times the above proportion.

In one embodiment, in the case where an ink composition containing the charge transport material is used as a material for forming a hole injection layer, the ink composition is applied to a hydrophilic electrode composed of ITO or the like. Many of the materials used for hole injection layers are hydrophobic, but in the present invention, by ensuring that the charge transport polymer in the ink composition contains a carbonyl-containing group, the affinity with hydrophilic electrodes of ITO or the like can be easily enhanced. As a result, the wetting properties between the hydrophilic electrode and the ink composition can be improved, and a uniform organic film can be more easily obtained.

The carbonyl-containing group is preferably introduced on at least one terminal of the charge transport polymer in the form of the substituent (C) or the substituent (CA). The substituent (C) or the substituent (CA) also preferably exists at a terminal from the viewpoint of simplifying the synthesis of the monomer compound used in forming the charge transport polymer. Specifically, the substituent (C) or substituent (CA) may exist as a substituent of a structural unit that constitutes either the main chain or a side chain of the charge transport polymer, but preferably exists as a substituent of a structural unit that constitutes a terminal of the charge transport polymer.

From the viewpoint of improving the wettability by the upper layer ink, the proportion of the above substituent (C) or substituent (CA) contained in the charge transport polymer, based on the total of all the structural units, is preferably at least 1 mol %, more preferably at least 2 mol %, and even more preferably 3 mol % or greater. In those cases where the charge transport polymer contains both the substituent (C) and the substituent (CA), the above proportion refers to the total amount of both substituents.

On the other hand, from the viewpoint of ensuring favorable solvent resistance relative to the upper layer ink, the above proportion based on the total of all the structural units is preferably not more than 99.9 mol %, more preferably not more than 99.5 mol %, and even more preferably 99 mol % or less. In the case of a monomer compound containing one of the substituent (C) within the molecule, the above mol % value is calculated as the proportion of the monomer compound containing the substituent (C) relative to the total amount of all the monomer compounds that constitute the polymer. In the case of a monomer compound containing two of the above substituents (C) in the molecule, the mol % value is two times the above proportion.

As described above, in an ink composition containing the charge transport material, by using a charge transport polymer having an alicyclic structure of 7 or more carbon atoms and a carbonyl-containing group, the ink wettability of the lower layer and the ink wettability of the organic film by the upper layer ink can both be improved.

In one embodiment, the charge transport material described above and an ink composition containing the charge transport material can be used favorably as hole injection layer materials. In this embodiment, excellent wettability of hydrophilic electrodes of ITO or the like can be achieved, and the organic film obtained following film formation exhibits excellent wettability by a hole transport layer ink used for forming an upper layer. As a result, when multilayering is performed using wet processes, organic films having uniform film thickness can be formed, and the characteristics of various types of elements can be improved.

The structure of the charge transport polymer is described below in further detail.

[Structure of Charge Transport Polymer]

The charge transport polymer contains at least one type of structural unit that has the ability to transport an electric charge. The charge transport polymer may be linear, or may have a branched structure. The charge transport polymer preferably contains at least a divalent structural unit L having charge transport properties and a monovalent structural unit T that forms the terminal portions, and more preferably also contains a trivalent or higher valent structural unit B that forms a branched portion. The charge transport polymer may have only one type of each of these structural units, or may contain a plurality of types of each structural unit. In the charge transport polymer, the various structural units are bonded together at "monovalent" to "trivalent or higher valent" bonding sites.

In one embodiment, the charge transport polymer contains the structural unit L and the structural unit T and contains the structural unit B as required, and the polymer molecule either (I) has both the monovalent substituent (A) having an alicyclic structure of 7 or more carbon atoms and the monovalent substituent (C) having a carbonyl-containing group existing independently of one another, or (II) has the monovalent substituent (CA) that includes a monovalent substituent having an alicyclic structure of 7 or more carbon atoms bonded directly to a carbonyl-containing group.

In a more specific embodiment, the charge transport polymer preferably contains both a structural unit represented by formula "—Ar-A" and a structural unit represented by formula "—Ar—C". In another embodiment, the charge transport polymer preferably contains at least a structural unit represented by formula "—Ar—X-A". In these formulas. Ar represents an arylene or heteroarylene contained within a structural unit that constitutes the charge transport polymer, whereas A. C and X are as described above.

In one embodiment, from the viewpoint of facilitating adjustment of the surface free energy and simplifying the polymer synthesis, the structural unit T that constitutes the polymer terminals preferably has a combination of the above substituent (A) and the above substituent (C), or has the above substituent (CA), and more preferably has the substituent (CA). Here, A is preferably the aforementioned A1. Further. C is preferably the aforementioned C1.

Examples of partial structures contained in the charge transport polymer are described below, but the charge transport polymer is not limited to polymers having the following partial structures. In the partial structures, "L" represents a structural unit L, "T" represents a structural unit T, and "B" represents a structural unit B. The symbol "*" represents a bonding site with another structural unit. In the following partial structures, the plurality of L units may be units having the same structure or units having mutually different structures. This also applies for the T and B units.

(Example of Linear Charge Transport Polymer)

T-L-L-L-L-* [Chemical formula 3]

(Examples of Charge Transport Polymers Having Branched Structures)

[Chemical formula 4]

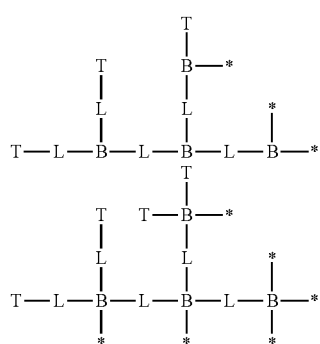

-continued

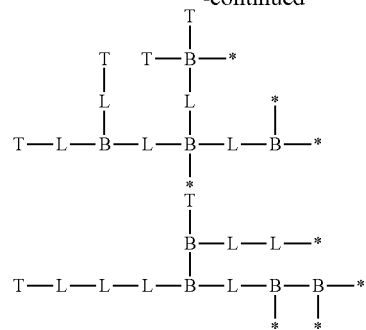

(Structural Unit L)

The structural unit L is a divalent structural unit having charge transport properties. There are no particular limitations on the structural unit L, provided it includes an atom grouping having the ability to transport an electric charge.

For example, the structural unit L may be selected from among substituted or unsubstituted structures including aromatic amine structures, carbazole structures, thiophene structures, fluorene structures, benzene structures, biphenyl structures, terphenyl structures, naphthalene structures, anthracene structures, tetracene structures, phenanthrene structures, dihydrophenanthrene structures, pyridine structures, pyrazine structures, quinoline structures, isoquinoline structures, quinoxaline structures, acridine structures, diazaphenanthrene structures, furan structures, pyrrole structures, oxazole structures, oxadiazole structures, thiazole structures, thiadiazole structures, triazole structures, benzothiophene structures, benzoxazole structures, benzoxadiazole structures, benzothiazole structures, benzothiadiazole structures, and benzotriazole structures. The structural unit L may also have two or more types of the above structures.

In one embodiment, from the viewpoint of obtaining superior hole transport properties, the structural unit L is preferably selected from among substituted or unsubstituted structures including aromatic amine structures, carbazole structures, thiophene structures, fluorene structures, benzene structures and pyrrole structures, and is more preferably selected from among substituted or unsubstituted aromatic amine structures and carbazole structures.

In another embodiment, from the viewpoint of obtaining superior electron transport properties, the structural unit L is preferably selected from among substituted or unsubstituted structures including fluorene structures, benzene structures, phenanthrene structures, pyridine structures, and quinoline structures.

Specific examples of the structural unit L are shown below. However, the structural unit L is not limited to the following structures.

[Chemical formula 5]

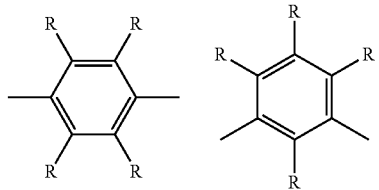

-continued
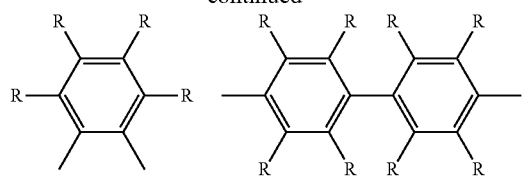
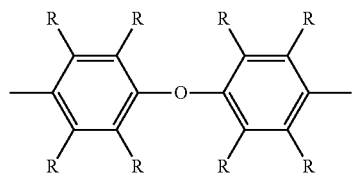
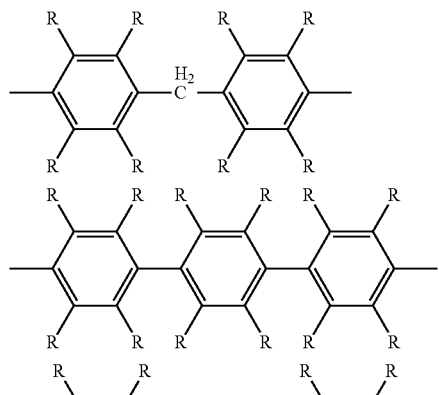
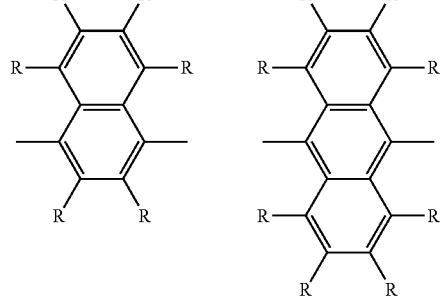
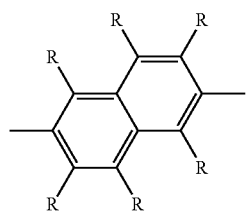
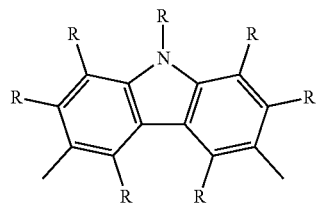
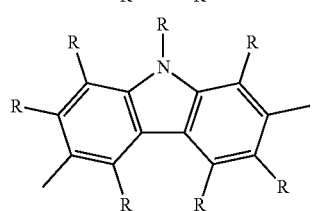
-continued
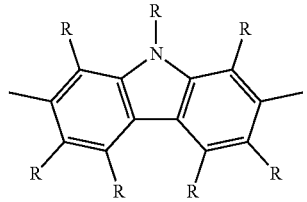
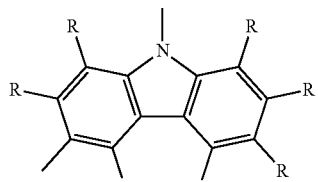
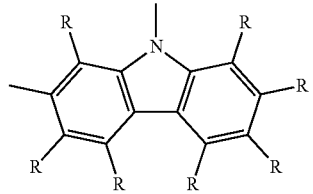
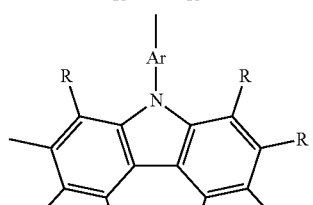
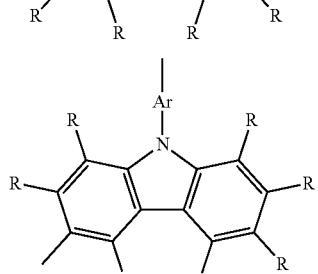
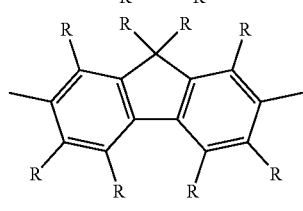
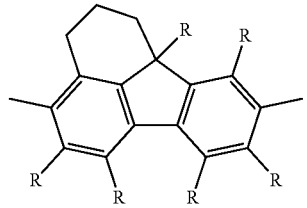
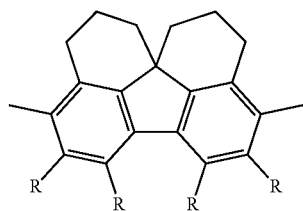

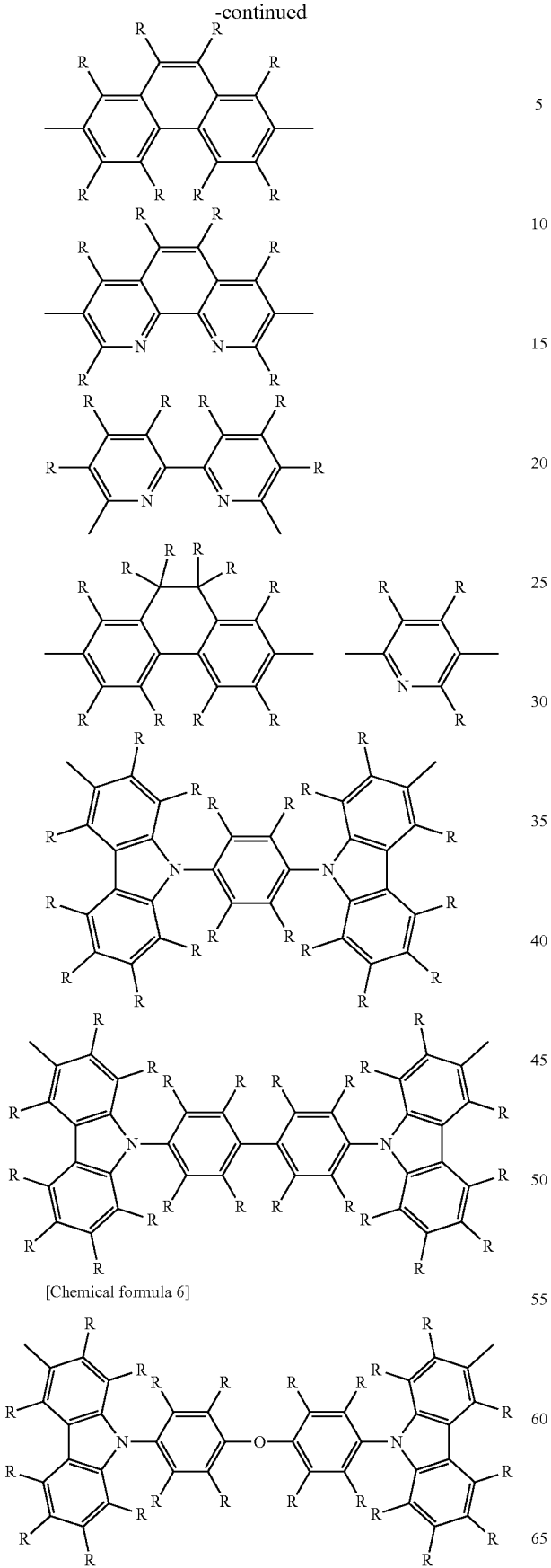
[Chemical formula 6]

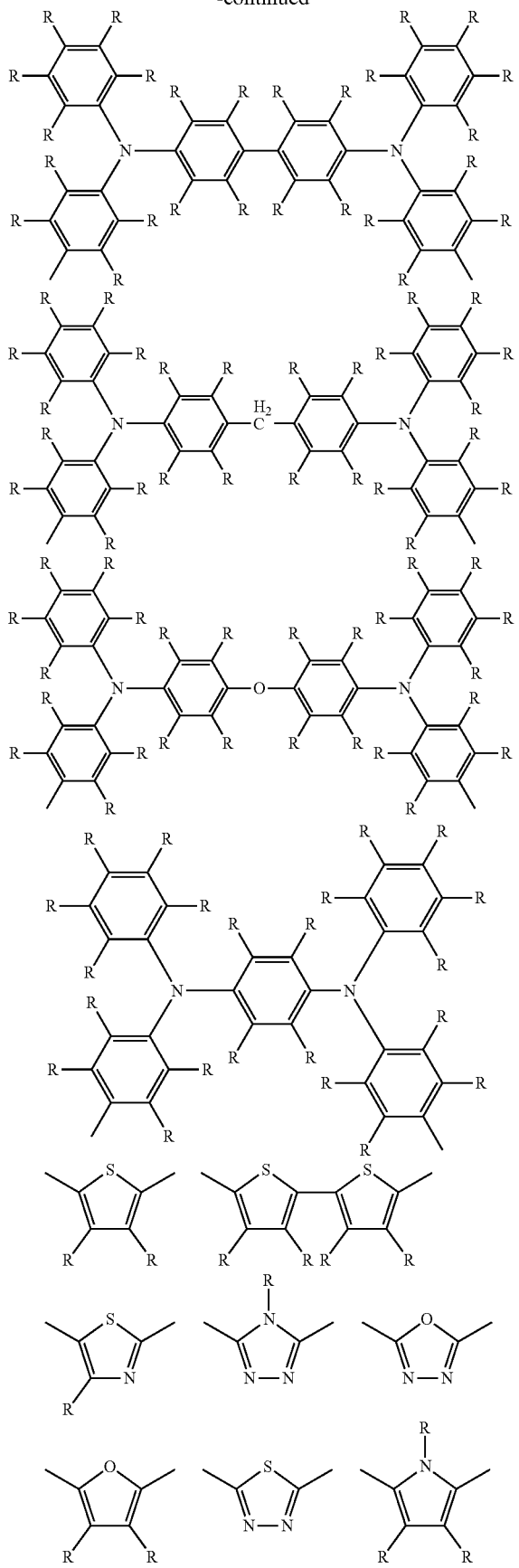
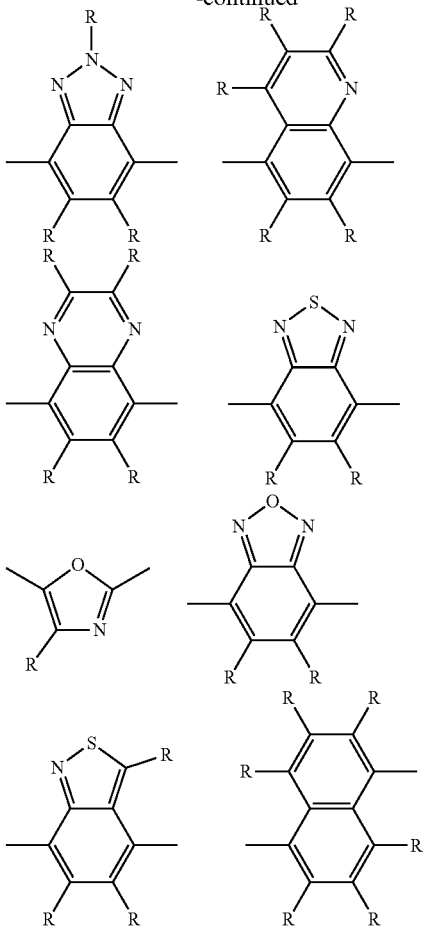

In the above structural units, each R independently represents a hydrogen atom or a substituent. In one embodiment, R may be at least one group selected from the group consisting of the aforementioned monovalent substituent (A) having a alicyclic structure of 7 or more carbon atoms, the aforementioned monovalent substituent (C) having a carbonyl-containing group, and the aforementioned monovalent substituent (CA) represented by formula "—X-A" in which a monovalent substituent having an alicyclic structure of 7 or more carbon atoms is bonded directly to a carbonyl-containing group.

In another embodiment, each R may be independently selected from a group consisting of $-R^1$, $-OR^2$, $-SR^3$, $-SiR^6R^7R^8$, halogen atoms, and groups containing a polymerizable functional group described below. Each of $R_1$ to $R^8$ independently represents a hydrogen atom, a linear, cyclic or branched alkyl group of 1 to 22 carbon atoms (excluding cyclic alkyl groups of 7 or more carbon atoms), or an aryl group or heteroaryl group of 2 to 30 carbon atoms.

An aryl group is an atom grouping in which one hydrogen atom has been removed from an aromatic hydrocarbon. A heteroaryl group is an atom grouping in which one hydrogen atom has been removed from an aromatic heterocycle. The alkyl group may be further substituted with an aryl group or heteroaryl group of 2 to 20 carbon atoms, and the aryl group or heteroaryl group may be further substituted with a linear, cyclic or branched alkyl group of 1 to 22 carbon atoms (excluding cyclic alkyl groups of 7 or more carbon atoms).

R is preferably a hydrogen atom, an alkyl group, an aryl group, or an alkyl-substituted aryl group. Ar represents an arylene group or heteroarylene group of 2 to 30 carbon atoms. An arylene group is an atom grouping in which two hydrogen atoms have been removed from an aromatic hydrocarbon. A heteroarylene group is an atom grouping in which two hydrogen atoms have been removed from an aromatic heterocycle. Ar is preferably an arylene group, and is more preferably a phenylene group.

Examples of the aromatic hydrocarbon include monocyclic hydrocarbons, condensed ring hydrocarbons, and polycyclic hydrocarbons in which two or more hydrocarbons selected from among monocyclic hydrocarbons and condensed ring hydrocarbons are bonded together via single bonds. Examples of the aromatic heterocycles include monocyclic heterocycles, condensed ring heterocycles, and polycyclic heterocycles in which two or more heterocycles selected from among monocyclic heterocycles and condensed ring heterocycles are bonded together via single bonds.

(Structural Unit B)

The structural unit B is a trivalent or higher valent structural unit that constitutes a branched portion in those cases where the charge transport polymer has a branched structure. From the viewpoint of improving the durability of organic electronic elements, the structural unit B is preferably not higher than hexavalent, and is more preferably either trivalent or tetravalent.

The structural unit B is preferably a unit that has charge transport properties. For example, from the viewpoint of improving the durability of organic electronic elements, the structural unit B is preferably selected from among substituted or unsubstituted structures including aromatic amine structures, carbazole structures, and condensed polycyclic aromatic hydrocarbon structures.

Specific examples of the structural unit B are shown below. However, the structural unit B is not limited to the following structures.

[Chemical formula 7]

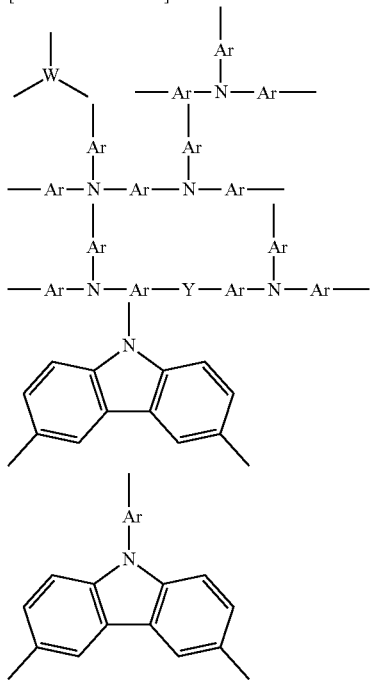

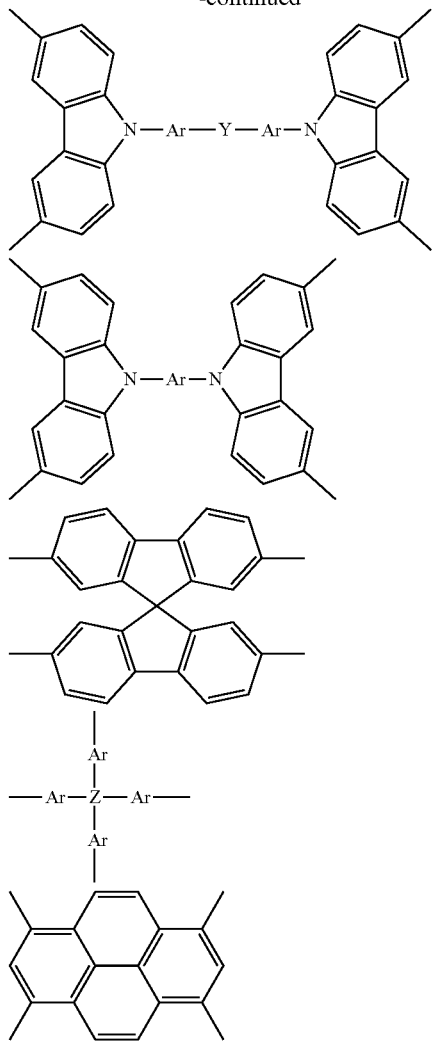

W represents a trivalent linking group, and for example, represents an arenetriyl group or heteroarenetriyl group of 2 to 30 carbon atoms. An arenetriyl group is an atom grouping in which three hydrogen atoms have been removed from an aromatic hydrocarbon. A heteroarenetriyl group is an atom grouping in which three hydrogen atoms have been removed from an aromatic heterocycle.

Each Ar independently represents a divalent linking group, and may independently represent an arylene group or heteroarylene group of 2 to 30 carbon atoms. Ar preferably represents an arylene group, and more preferably a phenylene group.

Y represents a divalent linking group, and examples include divalent groups in which an additional hydrogen atom has been removed from any of the R groups having one or more hydrogen atoms (but excluding groups containing a polymerizable functional group) described in relation to the structural unit L.

Z represents a carbon atom, a silicon atom or a phosphorus atom. In the structural units, the benzene rings and Ar groups may each have a substituent. Examples of the substituent include the R groups in the structural unit L. In other words, in one embodiment, within the structural unit, the benzene ring or Ar group may have at least one substituent selected from the group consisting of the aforementioned monovalent substituent (A) having a alicyclic structure of 7 or more carbon atoms, the aforementioned monovalent substituent (C) having a carbonyl-containing group, and the aforementioned monovalent substituent (CA) represented by formula "—X-A" in which a monovalent substituent having an alicyclic structure of 7 or more carbon atoms is bonded directly to a carbonyl-containing group.

(Structural Unit T)

The structural unit T is a monovalent structural unit that constitutes a terminal portion of the charge transport polymer. There are no particular limitations on the structural unit T, which may be selected from among substituted or unsubstituted structures including aromatic hydrocarbon structures, aromatic heterocyclic structures, and structures containing one, or two or more, of these structures. The structural unit T may have a similar structure to the structural unit L. In one embodiment, from the viewpoint of imparting durability to the polymer without impairing the charge transport properties, the structural unit T is preferably a substituted or unsubstituted aromatic hydrocarbon structure, and is more preferably a substituted or unsubstituted benzene structure. Further, in another embodiment, when the charge transport polymer has a polymerizable functional group at a terminal portion in the manner described below, the structural unit T may be a polymerizable structure (for example, a polymerizable functional group such as a pyrrolyl group).

A specific example of the structural unit T is shown below. However, the structural unit T is not limited to the structure below.

[Chemical formula 8]

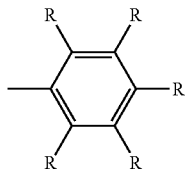

(t)

R is the same as R described in relation to the structural unit L, and in one embodiment, R may be at least one substituent selected from the group consisting of the aforementioned monovalent substituent (A) having a alicyclic structure of 7 or more carbon atoms, the aforementioned monovalent substituent (C) having a carbonyl-containing group, and the aforementioned monovalent substituent (CA) represented by formula "—X-A" in which a monovalent substituent having an alicyclic structure of 7 or more carbon atoms is bonded directly to a carbonyl-containing group.

In those cases where the charge transport polymer has a polymerizable functional group at a terminal portion, it is preferable that at least one R is a group containing a polymerizable functional group. In those cases where the charge transport polymer has a polymerizable functional group at a terminal portion, the solvent resistance of the obtained organic film can be easily enhanced.

In one embodiment, at least one of the substituent (A), the substituent (C) and the substituent (CA), and a polymerizable functional group may exist as mutually independent substituents. In other words, the polymerizable functional group is not included in the structure of the above substituents. In another embodiment, any of the substituent (A), the substituent (C) and the substituent (CA) may also include a polymerizable functional group structure.

(Polymerizable Functional Group)

In one embodiment, from the viewpoint of enabling the polymer to be cured by a polymerization reaction, thereby changing the degree of solubility in solvents, the charge transport polymer preferably has at least one polymerizable functional group. A "polymerizable functional group" refers to a group which is able to form bonds upon the application of at least one of heat and light.

Examples of the polymerizable functional group include groups having a carbon-carbon multiple bond (such as a vinyl group, allyl group, butenyl group, ethynyl group, acryloyl group, acrloyloxy group, acryloylamino group, methacryloyl group, methacryloyloxy group, methacryloylamino group, vinyloxy group and vinylamino group), groups having a small ring (including cyclic alkyl groups such as a cyclopropyl group and cyclobutyl group; cyclic ether groups such as an epoxy group (oxiranyl group) and oxetane group (oxetanyl group); diketene groups; episulfide groups; lactone groups; and lactam groups); and heterocyclic groups (such as a furanyl group, pyrrolyl group, thiophenyl group and silolyl group).

Particularly preferred polymerizable functional groups include a vinyl group, acryloyl group, methacryloyl group, epoxy group and oxetane group, and from the viewpoints of improving the reactivity and the characteristics of the organic electronic element, a vinyl group, oxetane group or epoxy group is even more preferred.

In one embodiment, the charge transport polymer preferably has a structural unit T1, which does not contain a polymerizable functional group and has at least one of the substituent (A), the substituent (C) and the substituent (CA), and a structural unit T2 that contains a polymerizable functional group. In one embodiment, by using a charge transport material containing the above charge transport polymer, an ink composition can be formed that exhibits excellent wettability of the lower layer. Further, by using that ink composition, an organic film that exhibits excellent wettability by the upper layer ink can be formed, and superior curability can be more easily achieved.

More specifically, the structural unit T1 has a structure (t) shown above, wherein at least one R is an aforementioned substituent (A), substituent (C) or substituent (CA) that does not contain a polymerizable functional group. R is more preferably a substituent (CA) that does not contain a polymerizable functional group.

On the other hand, the structural unit T2 has a structure (t) wherein at least one R is a polymerizable functional group selected from the group consisting of a vinyl group, an oxetane group and an epoxy group. R is more preferably an oxetane group.

From the viewpoints of increasing the degree of freedom associated with the polymerizable functional group and facilitating the polymerization reaction, the main backbone of the charge transport polymer and the polymerizable functional group are preferably linked via an alkylene chain. Further, in the case where, for example, the organic layer is to be formed on an electrode, from the viewpoint of enhancing the affinity with hydrophilic electrodes of ITO or the like, the main backbone and the polymerizable functional group are preferably linked via a hydrophilic chain such as an ethylene glycol chain or a diethylene glycol chain. Moreover, from the viewpoint of simplifying preparation of the monomer used for introducing the polymerizable functional group, the charge transport polymer may have an ether linkage or an ester linkage at the terminal of the alkylene chain or the hydrophilic chain, namely, at the linkage site between these chains and the polymerizable functional group, or at the linkage site between these chains and the charge transport polymer backbone. Examples of groups that can be used favorably as the polymerizable functional group include the polymerizable functional groups disclosed in WO 2010/140553.

The polymerizable functional group may be introduced at a terminal portion of the charge transport polymer (namely, a structural unit T), at a portion other than a terminal portion (namely, a structural unit L or B), or at both a terminal portion and a portion other than a terminal. From the viewpoint of the curability, the polymerizable functional group is preferably introduced at least at a terminal portion, and from the viewpoint of achieving a combination of favorable curability and charge transport properties, is preferably introduced only at terminal portions. Further, in those cases where the charge transport polymer has a branched structure, the polymerizable functional group may be introduced within the main chain of the charge transport polymer, within a side chain, or within both the main chain and a side chain.

From the viewpoint of contributing to a change in the degree of solubility, the polymerizable functional group is preferably included in the charge transport polymer in a large amount. On the other hand, from the viewpoint of not impeding the charge transport properties, the amount included in the charge transport polymer is preferably kept small. The amount of the polymerizable functional group may be set as appropriate with due consideration of these factors.

For example, from the viewpoint of obtaining a satisfactory change in the degree of solubility, the number of polymerizable functional groups per one molecule of the charge transport polymer is preferably at least 2, and more preferably 3 or greater. Further, from the viewpoint of maintaining good charge transport properties, the number of polymerizable functional groups is preferably not more than 1,000, and more preferably 500 or fewer.

The number of polymerizable functional groups per one molecule of the charge transport polymer can be determined as an average value from the amount of the polymerizable functional group used in synthesizing the charge transport polymer (for example, the amount added of the monomer having the polymerizable functional group), the amounts added of the monomers corresponding with the various structural units, and the weight average molecular weight of the charge transport polymer and the like. Further, the number of polymerizable functional groups can also be calculated as an average value using the ratio between the integral of the signal attributable to the polymerizable functional group and the integral of the total spectrum in the $^1$H-NMR (nuclear magnetic resonance) spectrum of the charge transport polymer, and the weight average molecular weight of the charge transport polymer and the like. In terms of ease of calculation, if the amounts added of the various components are clear, then the number of polymerizable functional groups preferably employs the value determined using these amounts.

(Number Average Molecular Weight)

The number average molecular weight of the charge transport polymer can be adjusted appropriately with due consideration of the solubility in solvents and the film formability and the like. From the viewpoint of ensuring superior charge transport properties, the number average molecular weight is preferably at least 500, more preferably at least 1.000, and even more preferably 2,000 or greater. Further, from the viewpoints of maintaining favorable solubility in solvents and facilitating the preparation of ink compositions, the number average molecular weight is preferably not more than 1,000,000, more preferably not more than 100,000, and even more preferably 50,000 or less. In one embodiment, the number average molecular weight of the charge transport polymer is preferably from 5,000 to 40,000, more preferably from 10,000 to 30,000, and even more preferably from 14,000 to 25,000.

(Weight Average Molecular Weight)

The weight average molecular weight of the charge transport polymer can be adjusted appropriately with due consideration of the solubility in solvents and the film formability and the like. From the viewpoint of ensuring superior charge transport properties, the weight average molecular weight is preferably at least 1,000, more preferably at least 5,000, and even more preferably 10,000 or greater. Further, from the viewpoints of maintaining favorable solubility in solvents and facilitating the preparation of ink compositions, the weight average molecular weight is preferably not more than 1,000,000, more preferably not more than 700,000, and even more preferably 400,000 or less. In one embodiment, the weight average molecular weight of the charge transport polymer is preferably from 35,000 to 200,000, more preferably from 40,000 to 100,000, and even more preferably from 46,000 to 70,000.

The number average molecular weight and the weight average molecular weight can be measured by gel permeation chromatography (GPC), using a calibration curve of standard polystyrenes.

(Proportions of Structural Units)

From the viewpoint of ensuring satisfactory charge transport properties, the proportion of the structural unit L contained in the charge transport polymer, based on the total of all the structural units, is preferably at least 10 mol %, more preferably at least 20 mol %, and even more preferably 30 mol % or higher. If the structural unit T and the optionally introduced structural unit B are taken into consideration, then the proportion of the structural unit L is preferably not more than 95 mol %, more preferably not more than 90 mol %, and even more preferably 85 mol % or less.

From the viewpoint of improving the characteristics of organic electronic elements, or from the viewpoint of suppressing any increase in viscosity and enabling more favorable synthesis of the charge transport polymer, the proportion of the structural unit T contained in the charge transport polymer, based on the total of all the structural units, is preferably at least 5 mol %, more preferably at least 10 mol %, and even more preferably 15 mol % or higher. Further, from the viewpoint of ensuring satisfactory charge transport properties, the proportion of the structural unit T is preferably not more than 60 mol %, more preferably not more than 55 mol %, and even more preferably 50 mol % or less.

In those cases where the charge transport polymer includes the structural unit B, from the viewpoint of improving the durability of organic electronic elements, the proportion of the structural unit B, based on the total of all the structural units, is preferably at least 1 mol %, more preferably at least 5 mol %, and even more preferably 10 mol % or higher. Further, from the viewpoints of suppressing any increase in viscosity and enabling more favorable synthesis of the charge transport polymer, or from the viewpoint of ensuring satisfactory charge transport properties, the proportion of the structural unit B is preferably not more than 50 mol %, more preferably not more than 40 mol %, and even more preferably 30 mol % or less.

In those cases where the charge transport polymer has a polymerizable functional group, from the viewpoint of ensuring efficient curing of the charge transport polymer, the proportion of the polymerizable functional group, based on the total of all the structural units, is preferably at least 0.1 mol %, more preferably at least 1 mol %, and even more preferably 3 mol % or higher. Further, from the viewpoint of ensuring favorable charge transport properties, the proportion of the polymerizable functional group is preferably not more than 70 mol %, more preferably not more than 60 mol %, and even more preferably 50 mol % or less. Here, the "proportion of the polymerizable functional group" refers to the proportion of structural units having the polymerizable functional group.

Considering the balance between the charge transport properties, the durability, and the productivity and the like, the ratio (molar ratio) between the structural unit L and the structural unit T is preferably L:T=100:(1 to 5), more preferably 100:(5 to 10), and even more preferably 100:(10 to 20). Further, in those cases where the charge transport polymer also includes the structural unit B, the ratio (molar ratio) between the structural unit L, the structural unit T and the structural unit B is preferably L:T:B=100:(10 to 200):(10 to 100), more preferably 100:(20 to 180):(20 to 90), and even more preferably 100:(40 to 160):(30 to 80). In one embodiment, the structural unit T means the combination of T1 and T2.

The proportion of each structural unit can be determined from the amount added of the monomer corresponding with that structural unit during synthesis of the charge transport polymer. Further, the proportion of each structural unit can also be calculated as an average value using the integral of the spectrum attributable to the structural unit in the $^1$H-NMR spectrum of the charge transport polymer. In terms of ease of calculation, if the amount added of the monomer is clear, then the proportion of the structural unit preferably employs the value determined using the amount added of the monomer.

(Production Method)

The charge transport polymer can be produced by various synthesis methods, and there are no particular limitations. For example, conventional coupling reactions such as the Suzuki coupling, Negishi coupling, Sonogashira coupling, Stille coupling and Buchwald-Hartwig coupling reactions can be used. The Suzuki coupling is a reaction in which a cross-coupling reaction is initiated between an aromatic boronic acid derivative and an aromatic halide using a Pd catalyst. By using a Suzuki coupling, the charge transport polymer can be produced easily by bonding together the desired aromatic rings.

In the coupling reaction, a Pd(0) compound, Pd(II) compound, or Ni compound or the like is used as a catalyst. Further, a catalyst species generated by mixing a precursor such as tris(dibenzylideneacetone)dipalladium(0) or palladium(II) acetate with a phosphine ligand can also be used. Reference may also be made to WO 2010/140553 in relation to synthesis methods for the charge transport polymer.

[Dopant]

The charge transport material may also contain a dopant. There are no particular limitations on the dopant, provided it is a compound that yields a doping effect upon addition to the charge transport material, enabling an improvement in the charge transport properties. Doping includes both p-type doping and n-type doping. In p-type doping, a substance that functions as an electron acceptor is used as the dopant, whereas in n-type doping, a substance that functions as an electron donor is used as the dopant.

To improve the hole transport properties, p-type doping is preferably performed, whereas to improve the electron transport properties, n-type doping is preferably performed.

The dopant used in the charge transport material may be a dopant that exhibits either a p-type doping effect or an n-type doping effect. Further, a single type of dopant may be added alone, or a mixture of a plurality of dopant types may be added.

The dopants used in p-type doping are electron-accepting compounds, and examples include Lewis acids, protonic acids, transition metal compounds, ionic compounds, halogen compounds and π-conjugated compounds. Specific examples include Lewis acids such as $FeCl_3$, $PF_5$, $AsF_5$, $SbF_5$, $BF_5$, $BCl_3$ and $BBr_3$; protonic acids, including inorganic acids such as HF, HCl, HBr, $HNO_3$, $H_2SO_4$ and $HClO_4$, and organic acids such as benzenesulfonic acid, p-toluenesulfonic acid, dodecylbenzenesulfonic acid, polyvinylsulfonic acid, methanesulfonic acid, trifluoromethanesulfonic acid, trifluoroacetic acid, 1-butanesulfonic acid, vinylphenylsulfonic acid and camphorsulfonic acid; transition metal compounds such as FeOCl, $TiCl_4$, $ZrCl_4$, $HfCl_4$, $NbF_5$, $AlCl_3$, $NbCl_5$, $TaCl_5$ and $MoF_5$; ionic compounds, including salts containing a perfluoro anion such as a tetrakis(pentafluorophenyl)borate ion, tris(trifluoromethanesulfonyl)methide ion, bis(trifluoromethanesulfonyl)imide ion, hexafluoroantimonate ion, $AsF_6^-$ (hexafluoroarsenate ion), $BF_4^-$ (tetrafluoroborate ion) or $PF_6^-$ (hexafluorophosphate ion), and salts having a conjugate base of an aforementioned protonic acid as an anion; halogen compounds such as $Cl_2$, $Br_2$, $I_2$, ICl, $ICl_3$, IBr and IF; and π-conjugated compounds such as TCNE (tetracyanoethylene) and TCNQ (tetracyanoquinodimethane).

Further, the electron-accepting compounds disclosed in JP 2000-36390 A, JP 2005-75948 A, and JP 2003-213002 A and the like can also be used. Among the above dopants, Lewis acids, ionic compounds, and π-conjugated compounds and the like are preferred, ionic compounds are more preferred, and onium salts are particularly desirable. An onium salt means a compound composed of a cation containing an onium ion such as an iodonium or ammonium ion, and a counter anion.

The dopants used in n-type doping are electron-donating compounds, and examples include alkali metals such as Li and Cs, alkaline earth metals such as Mg and Ca, salts of alkali metals or alkaline earth metals such as LiF and $Cs_2CO_3$, metal complexes, and electron-donating organic compounds.

In those cases where the charge transport polymer has a polymerizable functional group, in order to make it easier to change the degree of solubility of the organic layer, the use of a compound that can function as a polymerization initiator for the polymerizable functional group as the dopant is preferred.

[Other Optional Components]

The charge transport material may also contain charge transport low-molecular weight compounds, or other polymers or the like.

[Contents]

From the viewpoint of obtaining favorable charge transport properties, the amount of the charge transport polymer, relative to the total mass of the charge transport material, is preferably at least 50% by mass, more preferably at least 70% by mass, and even more preferably 80% by mass or greater. The amount may be 100% by mass.

When a dopant is included, from the viewpoint of improving the charge transport properties of the charge transport material, the amount of the dopant relative to the total mass of the charge transport material is preferably at least 0.01% by mass, more preferably at least 0.1% by mass, and even more preferably 0.5% by mass or greater.

Further, from the viewpoint of maintaining favorable film formability, the amount of the dopant relative to the total mass of the charge transport material is preferably not more than 50% by mass, more preferably not more than 30% by mass, and even more preferably 20% by mass or less.

<Ink Composition>

In one embodiment, an ink composition contains the charge transport material of an embodiment described above, and a solvent capable of dissolving or dispersing the material. By using the ink composition, an organic layer can be formed easily using a simple coating method.

[Solvent]

Water, organic solvents, or mixed solvents thereof can be used as the solvent. Examples of the organic solvent include alcohols such as methanol, ethanol and isopropyl alcohol; alkanes such as pentane, hexane and octane; cyclic alkanes such as cyclohexane; aromatic hydrocarbons such as benzene, toluene, xylene, mesitylene, tetralin and diphenylmethane: aliphatic ethers such as ethylene glycol dimethyl ether, ethylene glycol diethyl ether and propylene glycol-1-monomethyl ether acetate; aromatic ethers such as 1,2-dimethoxybenzene, 1,3-dimethoxybenzene, anisole, phenetole, 2-methoxytoluene, 3-methoxytoluene, 4-methoxytoluene, 2,3-dimethylanisole and 2,4-dimethylanisole; aliphatic esters such as ethyl acetate, n-butyl acetate, ethyl lactate and n-butyl lactate; aromatic esters such as phenyl acetate, phenyl propionate, methyl benzoate, ethyl benzoate, propyl benzoate and n-butyl benzoate; amide-based solvents such as N,N-dimethylformamide and N,N-dimethylacetamide; as well as dimethyl sulfoxide, tetrahydrofuran, acetone, chloroform and methylene chloride and the like. Among the above solvents, aromatic hydrocarbons, aliphatic esters, aromatic esters, aliphatic ethers, and aromatic ethers are preferred. In one embodiment, the solvent used to prepare an ink composition for forming a hole injection layer is preferably an aromatic hydrocarbon, and among such aromatic hydrocarbons, is more preferably toluene.

[Polymerization Initiator]

In those cases where the charge transport polymer has a polymerizable functional group, the ink composition preferably contains a polymerization initiator. Conventional radical polymerization initiators, cationic polymerization initiators, and anionic polymerization initiators and the like can be used as the polymerization initiator. From the viewpoint of enabling simple preparation of the ink composition, the use of a substance that exhibits both a function as a dopant and a function as a polymerization initiator is preferred. Examples of such substances include the ionic compounds described above. In one embodiment, the onium salts described above can be used particularly favorably. Specific examples include salts of a perfluoro anion and a cation such as an iodonium ion or an ammonium ion.

[Additives]

The ink composition may also contain additives as optional components. Examples of these additives include polymerization inhibitors, stabilizers, thickeners, gelling agents, flame retardants, antioxidants, reduction inhibitors, oxidizing agents, reducing agents, surface modifiers, emulsifiers, antifoaming agents, dispersants and surfactants.

[Contents]

The amount of the solvent in the ink composition can be determined with due consideration of the use of the composition in various application methods. For example, the amount of the solvent is preferably an amount that yields a ratio of the charge transport polymer relative to the solvent that is at least 0.1% by mass, more preferably at least 0.2% by mass, and even more preferably 0.5% by mass or greater.

Further, the amount of the solvent is preferably an amount that yields a ratio of the charge transport polymer relative to the solvent that is not more than 20% by mass, more preferably not more than 15% by mass, and even more preferably 10/o by mass or less.

<Organic Layer>

In one embodiment, an organic layer is a layer formed using the charge transport material or the ink composition of an embodiment described above. By using the ink composition, an organic layer can be formed favorably by a coating method. Examples of the coating method include conventional methods such as spin coating methods, casting methods, dipping methods, plate-based printing methods such as relief printing, intaglio printing, offset printing, lithographic printing, relief reversal offset printing, screen printing and gravure printing, and plateless printing methods such as inkjet methods. When the organic layer is formed by a coating method, the organic layer (coating layer) obtained following coating may be dried using a hot plate or an oven to remove the solvent.

In those cases where the charge transport polymer has a polymerizable functional group, a polymerization reaction of the charge transport polymer can be initiated by performing light irradiation or a heat treatment or the like, thereby changing the degree of solubility of the organic layer. By stacking organic layers having changed degrees of solubility, multilayering of an organic electronic element can be performed with ease. Reference may also be made to WO 2010/140553 in relation to the method used for forming the organic layer.

From the viewpoint of improving the efficiency of charge transport, the thickness of the organic layer obtained following drying or curing is preferably at least 0.1 nm, more preferably at least 1 nm, and even more preferably 3 nm or greater.

Further, from the viewpoint of reducing the electrical resistance, the thickness of the organic layer is preferably not more than 300 nm, more preferably not more than 200 nm, and even more preferably 100 nm or less.

<Organic Electronic Element>

In one element, an organic electronic element has at least the organic layer of the embodiment described above. Examples of the organic electronic element include an organic EL element, an organic photoelectric conversion element, and an organic transistor and the like. The organic electronic element preferably has at least a structure in which the organic layer is disposed between a pair of electrodes.

[Organic EL Element]

In one embodiment, an organic EL element has at least the organic layer of the embodiment described above. The organic EL element typically includes a light-emitting layer, an anode, a cathode and a substrate, and if necessary, may also have other functional layers such as a hole injection layer, an electron injection layer, a hole transport layer and an electron transport layer. Each layer may be formed by a vapor deposition method, or by a coating method. The organic EL element preferably has the organic layer as the light-emitting layer or as another functional layer, more preferably has the organic layer as a functional layer, and even more preferably has the organic layer as at least one of a hole injection layer and a hole transport layer.

The FIGURE is a cross-sectional schematic view illustrating one embodiment of the organic EL element. The organic EL element in the FIGURE is an element with a multilayer structure, and has a substrate 8, an anode 2, a hole injection layer 3 and a hole transport layer 6 each formed from an organic layer of the embodiment described above, a light-emitting layer 1, an electron transport layer 7, an electron injection layer 5 and a cathode 4 provided in that order. Each of these layers is described below.

[Light-Emitting Layer]

Examples of the materials that can be used for the light-emitting layer include low-molecular weight compounds, polymers, and dendrimers and the like. Polymers exhibit good solubility in solvents and are suitable for coating methods, and are consequently preferred. Examples of the light-emitting material include fluorescent materials, phosphorescent materials, and thermally activated delayed fluorescent materials (TADF).

Specific examples of the fluorescent materials include low-molecular weight compounds such as perylene, coumarin, rubrene, quinacridone, stilbene, color laser dyes, aluminum complexes, and derivatives of these compounds: polymers such as polyfluorene, polyphenylene, polyphenylenevinylene, polyvinylcarbazole, fluorene-benzothiadiazole copolymers, fluorene-triphenylamine copolymers, and derivatives of these compounds; and mixtures of the above materials.

Examples of materials that can be used as the phosphorescent materials include metal complexes and the like containing a metal such as Ir or Pt or the like.

Specific examples of Ir complexes include FIr(pic) (iridium(III) bis[(4,6-difluorophenyl)-pyridinato-N,$C^2$]picolinate) which emits blue light, Ir(ppy)$_3$ (fac-tris(2-phenylpyridine)iridium) which emits green light, and (btp)$_2$Ir(acac) (bis[2-(2'-benzo[4,5-α]thienyl)pyridinato-N,$C^3$]iridium (acetyl-acetonate)) and Ir(piq)$_3$ (tris(1-phenylisoquinoline)iridium) which emit red light.

Specific examples of Pt complexes include PtOEP (2,3,7,8,12,13,17,18-octaethyl-21H,23H-porphyrin-platinum) which emits red light.

When the light-emitting layer contains a phosphorescent material, a host material is preferably also included in addition to the phosphorescent material. Low-molecular weight compounds, polymers, and dendrimers can be used as this host material. Examples of the low-molecular weight compounds include CBP (4,4'-bis(9H-carbazol-9-yl)-biphenyl), mCP (1,3-bis(9-carbazolyl)benzene), CDBP (4,4'-bis(carbazol-9-yl)-2,2'-dimethylbiphenyl), and derivatives of these compounds. Examples of the polymers include the charge transport material of the embodiment described above, polyvinylcarbazole, polyphenylene, polyfluorene, and derivatives of these polymers.

Examples of the thermally activated delayed fluorescent materials include the compounds disclosed in Adv. Mater., 21, 4802-4906 (2009); Appl. Phys. Lett., 98, 083302 (2011); Chem. Comm., 48, 9580 (2012); Appl. Phys. Lett., 101, 093306 (2012); J. Am. Chem. Soc., 134, 14706 (2012); Chem. Comm., 48, 11392 (2012); Nature, 492, 234 (2012); Adv. Mater., 25, 3319 (2013); J. Phys. Chem. A, 117, 5607 (2013); Phys. Chem. Chem. Phys., 15, 15850 (2013); Chem. Comm., 49, 10385 (2013); and Chem. Lett., 43, 319 (2014) and the like.

[Hole Injection Layer, Hole Transport Layer]

The organic layer formed using the charge transport material described above is preferably used as at least one of a hole injection layer and a hole transport layer, and is more preferably used as at least a hole injection layer. In those cases where the organic EL element has an organic layer formed using the charge transport material described above as a hole injection layer, and also has a hole transport layer, a conventional material may be used for the hole transport layer. Further, in those cases where the organic EL element has an organic layer formed using the charge transport material described above as a hole transport layer, and also has a hole injection layer, a conventional material may be used for the hole injection layer.

Examples of conventional materials that can be used for the hole injection layer and the hole transport layer include aromatic amine-based compounds (for example, aromatic diamines such as N,N'-di(naphthalen-1-yl)-N,N'-diphenylbenzidine (α-NPD)), phthalocyanine-based compounds, and thiophene-based compounds (for example, thiophene-based conductive polymers (such as poly(3,4-ethylenedioxythiophene):poly(4-styrenesulfonate) (PEDOT:PSS) and the like).

In one embodiment, it is preferable that a charge transport material containing a charge transport polymer having a triphenylamine structure is used to form the hole injection layer. In this case, considering the energy levels related to hole migration, the charge transport material described above can be used favorably as the material for forming the hole transport layer.

Although not a particular limitation, in embodiments in which the material of the hole injection layer contains a polymerization initiator and the material of the hole transport layer contains a branched polymer having a polymerizable functional group as the charge transport polymer, the hole transport layer is able to be cured favorably.

Further, by applying an upper layer ink to the hole transport layer formed from the cured organic film, thereby stacking another organic film, another layer such as a light-emitting layer can be formed.

[Electron Transport Layer, Electron Injection Layer]

Examples of materials that can be used for the electron transport layer and the electron injection layer include phenanthroline derivatives, bipyridine derivatives, nitro-substituted fluorene derivatives, diphenylquinone derivatives, thiopyran dioxide derivatives, condensed-ring tetracarboxylic acid anhydrides of naphthalene and perylene and the like, carbodiimides, fluorenylidenemethane derivatives, anthraquinodimethane and anthrone derivatives, oxadiazole derivatives, thiadiazole derivatives, benzimidazole derivatives, quinoxaline derivatives, and aluminum complexes. Further, the charge transport material of the embodiment described above may also be used.

[Cathode]

Examples of the cathode material include metals or metal alloys, such as Li, Ca, Mg, Al, In, Cs, Ba, Mg/Ag, LiF and CsF.

[Anode]

Metals (for example, Au) or other materials having conductivity can be used as the anode. Examples of the other materials include oxides (for example, ITO: indium oxide/tin oxide, and conductive polymers (for example, polythiophene-polystyrene sulfonate mixtures (PEDOT:PSS)).

[Substrate]

Glass and plastics and the like can be used as the substrate. The substrate is preferably transparent. Further, a flexible substrate having flexibility is preferred. Specifically, quartz glass and light-transmitting resin films and the like are preferred.

Examples of the resin films include films composed of polyethylene terephthalate, polyethylene naphthalate, polyethersulfone, polyetherimide, polyetheretherketone, polyphenylene sulfide, polyarylate, polyimide, polycarbonate, cellulose triacetate or cellulose acetate propionate.

In those cases where a resin film is used, an inorganic substance such as silicon oxide or silicon nitride may be coated onto the resin film to inhibit the transmission of water vapor and oxygen and the like.

[Emission Color]

There are no particular limitations on the color of the light emission from the organic EL element. White organic EL elements can be used for various illumination fixtures, including domestic lighting, in-vehicle lighting, watches and liquid crystal backlights, and are consequently preferred.

The method used for forming a white organic EL element may employ a method in which a plurality of light-emitting materials are used to emit a plurality of colors simultaneously, which are then mixed to obtain a white light emission. There are no particular limitations on the combination of the plurality of emission colors, and examples include combinations that include three maximum emission wavelengths for blue, green and red, and combinations that include two maximum emission wavelengths for blue and yellow, or for yellowish green and orange or the like. Control of the emission color can be achieved by appropriate adjustment of the types and amounts of the light-emitting materials.

<Display Element, Illumination Device, Display Device>

In one embodiment, a display element contains the organic EL element of the embodiment described above.

For example, by using the organic EL element as the element corresponding with each color pixel of red, green and blue (RGB), a color display element can be obtained. Examples of the image formation method include a simple matrix in which organic EL elements arrayed in a panel are driven directly by an electrode arranged in a matrix, and an active matrix in which a thin-film transistor is positioned on, and drives, each element.

Furthermore, in one embodiment, an illumination device contains the organic EL element of the embodiment described above. Moreover, in one embodiment, a display device contains the illumination device and a liquid crystal element as a display unit. For example, the display device may be a device that uses the illumination device of the embodiment described above as a backlight and uses a conventional liquid crystal element as the display unit, namely a liquid crystal display device.

EXAMPLES

The present invention is described below in further detail using a series of examples, but the present invention is not limited by the following examples.

1. Preparation of Charge Transport Polymers

<Preparation of Pd Catalyst>

In a glove box under a nitrogen atmosphere and at room temperature, tris(dibenzylideneacetone)dipalladium (Pd$_2$(dba)$_3$, 73.2 mg, 80 µmol) was weighed into a sample tube, toluene (16 mL) was added, and the resulting mixture was agitated for 30 minutes. In a similar manner, tris(t-butyl)phosphine (129.6 mg, 640 µmol) was weighed into a sample tube, toluene (4 mL) was added, and the resulting mixture was agitated for 5 minutes. The two solutions were then mixed together and stirred for 30 minutes at room temperature to obtain a catalyst. All the solvents were deaerated by nitrogen bubbling for at least 30 minutes prior to use.

<Charge Transport Polymer 1>

A three-neck round-bottom flask was charged with a monomer T1 shown below (4.0 mmol), a monomer L1 shown below (5.0 mmol), a monomer B1 shown below (2.0 mmol), methyl tri-n-octyl ammonium chloride ("Aliquat 336" manufactured by Alfa Aesar Ltd.) (0.03 g), potassium hydroxide (1.12 g), pure water (5.54 mL) and toluene (50 mL), and the prepared Pd catalyst toluene solution (1.0 mL) was then added. The resulting mixture was heated and refluxed for 2 hours. All the operations up to this point were conducted under a stream of nitrogen. Further, all of the solvents were deaerated by nitrogen bubbling for at least 30 minutes prior to use.

[Chemical formula 9]

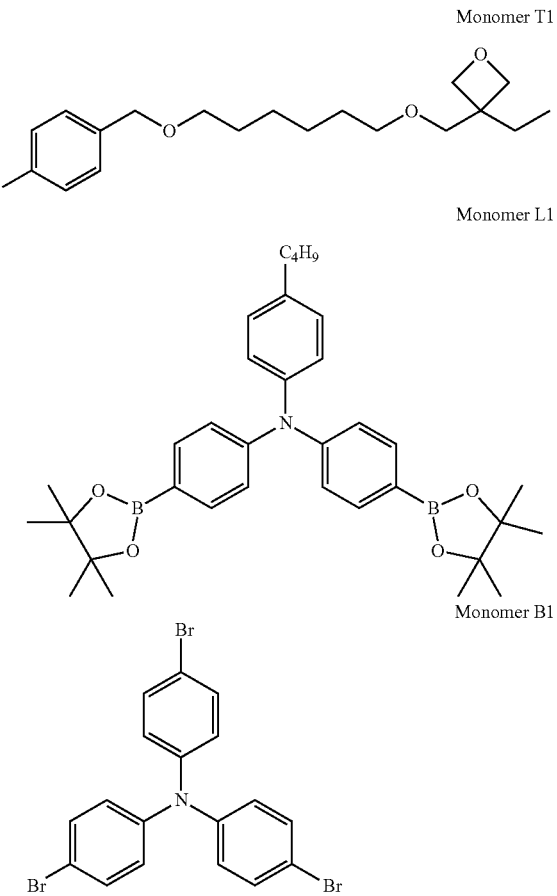

After completion of the reaction, the organic layer was washed with water and then poured into methanol-water (9:1). The resulting precipitate was collected by filtration under reduced pressure, and washed with methanol. The thus obtained precipitate was collected by filtration under reduced pressure and then dissolved in toluene, and a metal adsorbent ("Triphenylphosphine, polymer-bound on styrene-divinylbenzene copolymer", manufactured by Strem Chemicals Inc., 200 mg per 100 mg of the precipitate) was then added to the solution and stirred at 80° C. for 2 hours. Following completion of the stirring, the metal adsorbent and other insoluble matter were removed by filtration, and the filtrate was re-precipitated from methanol. The thus produced precipitate was collected by filtration under reduced pressure and washed with methanol. The obtained precipitate was then dried under vacuum to obtain a charge transport polymer 1. The thus obtained charge transport polymer 1 had a number average molecular weight of 13,600 and a weight average molecular weight of 72,800.

The number average molecular weight and the weight average molecular weight were measured by GPC (relative to polystyrene standards) using tetrahydrofuran (THF) as the eluent. The measurement conditions were as follows.

Feed pump: L-6050, manufactured by Hitachi High-Technologies Corporation

UV-Vis detector: L-3000, manufactured by Hitachi High-Technologies Corporation

Columns: Gelpack (a registered trademark) GL-A160S/GL-A150S, manufactured by Hitachi Chemical Co., Ltd.

Eluent: THF (for HPLC, stabilizer-free), manufactured by Wako Pure Chemical Industries, Ltd.

Flow rate: 1 ml/min

Column temperature: room temperature (23° C.)

Molecular weight standards: standard polystyrenes

<Charge Transport Polymer 2>

A three-neck round-bottom flask was charged with the monomer L1 shown above (5.0 mmol), the monomer B1 shown above (2.0 mmol), the monomer T1 shown above (1.0 mmol), a monomer T2 shown below (3.0 mmol) and toluene (50 mL), and the prepared Pd catalyst solution (1.0 mL) was then added. Thereafter, the same method as that described for the synthesis of the charge transport polymer 1 was used to synthesize a charge transport polymer 2. The thus obtained charge transport polymer 2 had a number average molecular of 14,800 and a mass average molecular weight of 46,200.

[Chemical formula 10]

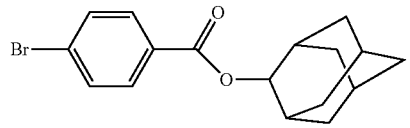

Monomer T2

<Charge Transport Polymer 3>

A three-neck round-bottom flask was charged with the monomer L1 shown above (5.0 mmol), the monomer B1 shown above (2.0 mmol), the monomer T1 shown above (1.0 mmol), a monomer T3 shown below (3.0 mmol) and toluene (50 mL), and the prepared Pd catalyst solution (1.0 mL) was then added. Thereafter, the same method as that described for the synthesis of the charge transport polymer 1 was used to synthesize a charge transport polymer 3. The thus obtained charge transport polymer 3 had a number average molecular of 24,700 and a mass average molecular weight of 49,100.

[Chemical formula 11]

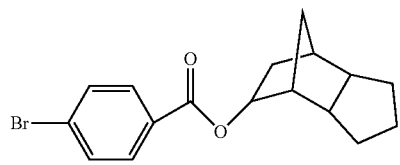

Monomer T3

<Charge Transport Polymer 4>

A three-neck round-bottom flask was charged with a monomer L2 shown below (5.0 mmol), the monomer B1 shown above (2.0 mmol), the monomer T1 shown above (1.0 mmol), the monomer T2 shown above (3.0 mmol) and toluene (50 mL), and the prepared Pd catalyst solution (1.0 mL) was then added. Thereafter, the same method as that described for the synthesis of the charge transport polymer 1 was used to synthesize a charge transport polymer 4. The thus obtained charge transport polymer 4 had a number average molecular of 19,300 and a weight average molecular weight of 68,700.

[Chemical formula 12]

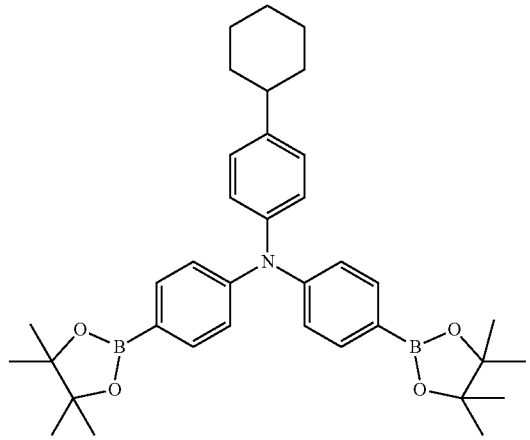

Monomer L2

<Charge Transport Polymer 5>

A three-neck round-bottom flask was charged with the monomer L1 shown above (5.0 mmol), the monomer B1 shown above (2.0 mmol), the monomer T1 shown above (1.0 mmol), a monomer T4 shown below (3.0 mmol) and toluene (50 mL), and the prepared Pd catalyst solution (1.0 mL) was then added. Thereafter, the same method as that described for the synthesis of the charge transport polymer 1 was used to synthesize a charge transport polymer 5. The thus obtained charge transport polymer 5 had a number average molecular of 14,400 and a mass average molecular weight of 46,400.

[Chemical formula 13]

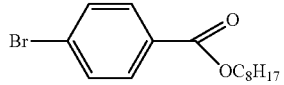

Monomer T4

<Charge Transport Polymer 6>

A three-neck round-bottom flask was charged with a monomer L3 shown below (5.0 mmol), the monomer B1 shown above (2.0 mmol), the monomer T1 shown above (4.0 mmol) and toluene (50 mL), and the prepared Pd catalyst solution (1.0 mL) was then added. Thereafter, the same method as that described for the synthesis of the charge transport polymer 1 was used to synthesize a charge transport polymer 6. The thus obtained charge transport polymer 6 had a number average molecular of 21,100 and a weight average molecular weight of 53,200.

[Chemical formula 14]

Monomer L3

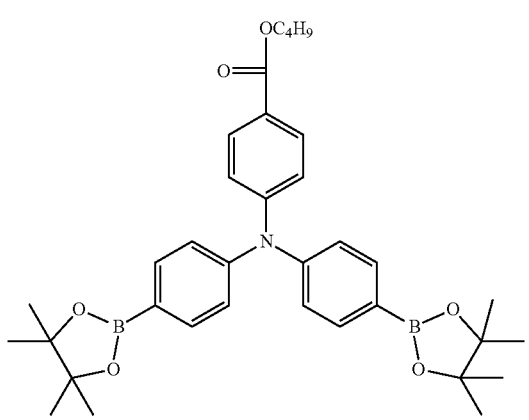

<Charge Transport Polymer 7>

A three-neck round-bottom flask was charged with the monomer L2 shown above (5.0 mmol), the monomer B1 shown above (2.0 mmol), a monomer T5 shown below (4.0 mmol) and toluene (50 mL), and the prepared Pd catalyst solution (1.0 mL) was then added. Thereafter, the same method as that described for the synthesis of the charge transport polymer 1 was used to synthesize a charge transport polymer 7. The thus obtained charge transport polymer 7 had a number average molecular of 17,000 and a weight average molecular weight of 32.000.

[Chemical formula 15]

Monomer T5

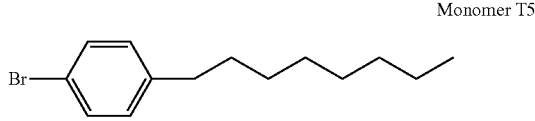

<Charge Transport Polymer 8>

A three-neck round-bottom flask was charged with the monomer L1 shown above (5.0 mmol), the monomer B1 shown above (2.0 mmol), a monomer T6 shown below (4.0 mmol) and toluene (50 mL), and the prepared Pd catalyst solution (1.0 mL) was then added. Thereafter, the same method as that described for the synthesis of the charge transport polymer 1 was used to synthesize a charge transport polymer 8. The thus obtained charge transport polymer 8 had a number average molecular of 22,200 and a weight average molecular weight of 61,100.

[Chemical formula 16]

Monomer T6

The monomers used in preparing the charge transport polymers 1 to 8 are summarized below in Table 1.

TABLE 1

| Charge transport polymer | Monomers used | | |
| --- | --- | --- | --- |
| | Structural unit L | Structural unit B | Structural unit T |
| Charge transport polymer 1 | L1 | B1 | T1 |
| Charge transport polymer 2 | L1 | B1 | T1 + T2 [CA] |
| Charge transport polymer 3 | L1 | B1 | T1 + T3 [CA] |
| Charge transport polymer 4 | L2 | B1 | T1 + T2 [CA] |
| Charge transport polymer 5 | L1 | B1 | T1 + T4 [C] |
| Charge transport polymer 6 | L3 [C] | B1 | T1 |
| Charge transport polymer 7 | L2 | B1 | T5 |
| Charge transport polymer 8 | L1 | B1 | T6 |

Notes: in the table, the superscript (CA) indicates that the structural unit has a substituent that includes a monovalent substituent having an alicyclic structure of 7 or more carbon atoms bonded directly to a carbonyl-containing group. Further, the superscript (C) indicates that the structural unit has a substituent having a carbonyl-containing group.

2. Evaluations of Charge Transport Materials (Ink Compositions) Containing Charge Transport Polymers Examples 1 to 3, Comparative Examples 1 to 5

Using the charge transport polymers 1 to 8 prepared in the manner described above, each of the evaluations described below was performed.

<Evaluation of Film Formability on ITO Substrate>

As shown in Table 2, using each of the charge transport polymers 1 to 8 prepared above, 10 mg of the polymer was dissolved in 1.094 mL of toluene to prepare a polymer solution. Further, an ionic compound 1 shown below (1.0 mg) was dissolved in 500 µL of toluene to obtain an ionic compound solution. The prepared polymer solution and 51 µL of the ionic compound solution were mixed together to prepare an ink composition.

[Chemical formula 17]

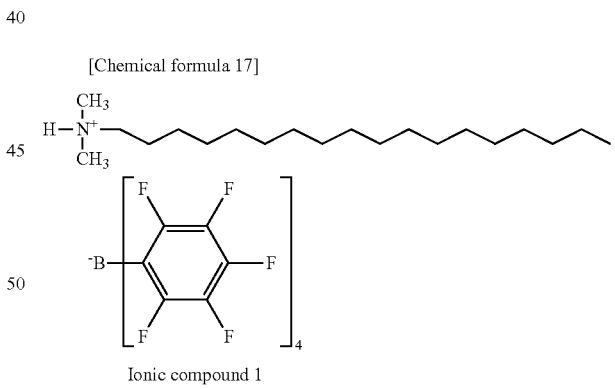

Ionic compound 1

Each ink composition was dripped onto an ITO substrate at room temperature (25° C.) and spin-coated at 3,000 rpm for 60 seconds to form an organic film. Subsequently, the ITO substrate was heated on a hot plate at 210° C. for 30 minutes, and the transparency of the organic film was then inspected visually.

Generally, in those cases where the ink wettability of the lower layer is poor, the ink does not spread satisfactorily on the surface of the lower layer during coating, and the organic film obtained following coating tends to have an uneven shape. Accordingly, when the ink wettability of the lower layer is poor, forming an organic film having uniform thickness within the plane is problematic. An organic film for which the thickness is non-uniform generates light scattering at the film surface, meaning the transparency deteriorates. For these types of reasons, the transparency of the organic film was inspected, and the film formability (wettability) was evaluated against the following criteria.

Evaluation Criteria:

Film formability A: the organic film is transparent with no visible cloudiness

Film formability B: cloudiness is visible in the organic film

<Evaluation of Change in the Degree of Solubility (Residual Film Ratio) of the Ink Composition>

As shown in Table 2, using each of the charge transport polymers 1 to 8 prepared above, 10 mg of the polymer was dissolved in 1.094 mL of toluene to prepare a polymer solution. Further, the ionic compound 1 shown above (1.0 mg) was dissolved in 500 μL of toluene to obtain an ionic compound solution.

The prepared polymer solution and the ionic compound solution (51 μL) were mixed together to prepare a coating solution (ink composition). The ink composition was dripped onto a quartz glass substrate at room temperature (25° C.) and spin-coated at 3,000 rpm for 60 seconds to form an organic film. Subsequently, the quartz glass substrate was heated on a hot plate at 210° C. for 30 minutes to cure the organic film.

Subsequently, the quartz glass substrate was grasped with a pair of tweezers and immersed in a 200 mL beaker filled with toluene (25° C.), and the quartz glass substrate was agitated 10 times back and forth in the thickness direction of the quartz glass substrate over a period of 10 seconds. The absorbance (Abs) at the absorption maximum (λmax) in the UV-vis spectrum of the organic film was measured before and after the immersion, and the residual film ratio of the organic film (cured film) was determined from the ratio between the two absorbance values using a formula 1 shown below.

Residual film ratio (%)=Abs of organic film after immersion/Abs of organic film before immersion×100     (Formula 1)

Measurement of the absorbance was performed using a spectrophotometer (U-3310, manufactured by Hitachi. Ltd.), by measuring the absorbance of the organic film at the maximum absorption wavelength within a wavelength range from 300 to 500 nm.

<Measurement of Surface Free Energy>

Using each of the charge transport polymers 1 to 8 prepared above, 10 mg of the polymer was dissolved in 1.094 mL of toluene to prepare a polymer solution. Further, the ionic compound 1 shown above (1.0 mg) was dissolved in 500 μL of toluene to obtain an ionic compound solution. The prepared polymer solution and the ionic compound solution (51 μL) were mixed together to prepare a coating solution (ink composition). The ink composition was dripped onto a quartz glass substrate at room temperature (25° C.) and spin-coated at 3,000 rpm for 60 seconds to form an organic film. Subsequently, the quartz glass substrate was heated on a hot plate at 210° C. for 30 minutes to cure the organic film.

Using dispensers, liquid droplets of pure water and diiodomethane were formed on the obtained organic film under a room temperature environment. Three droplets of each liquid were formed, images of these droplets were acquired from directly side-on using a CCD camera, the contact angles of the droplets were measured, and the average value was determined.

The obtained values were inserted into prescribed formulas (the formulas (5) and (6) described above), and the polar component (mJ/m) and non-polar component (mJ/m$^2$) of the surface free energy of the organic film were calculated. The measurement results are shown in Table 2.

<Evaluation of Upper Layer Film Formability>

A first organic film (hole injection layer) was formed on an ITO substrate using the same method as that described for measuring the residual film ratio. Subsequently, a polymer solution (ink) obtained by dissolving 10 mg of the charge transport polymer 8 in 1.094 mL of toluene was prepared as a hole transport layer material. By dripping the ink onto the first organic film, performing spin-coating at 3,000 rpm for 60 seconds, and then performing heating at 120° C. for 10 minutes, a second organic film (hole transport layer) with a film thickness of 40 nm was stacked on top of the first organic film.

The surface of the stacked second organic film was inspected visually, and based on the transparency of the organic film, the film formability (wettability) was evaluated against the following criteria.

Evaluation criteria:

Film formability A: the organic film is transparent with no visible cloudiness

Film formability B: cloudiness is visible in the organic film

TABLE 2

| | Charge transport polymer | Film formability on ITO substrate | Surface free energy Polar component | Non-polar component | Sum | Residual film ratio (%) | Upper layer film formability |
|---|---|---|---|---|---|---|---|
| Example 1 | Polymer 2 | A | 1.09 | 41.53 | 42.62 | 97.6 | A |
| Example 2 | Polymer 3 | A | 1.10 | 41.70 | 42.80 | 99.1 | A |
| Example 3 | Polymer 4 | A | 1.33 | 44.13 | 45.46 | 94.9 | A |
| Comparative Example 1 | Polymer 1 | A | 1.80 | 39.86 | 41.66 | 99.9 | B |
| Comparative Example 2 | Polymer 5 | A | 0.78 | 38.95 | 39.73 | 99.4 | B |
| Comparative Example 3 | Polymer 6 | A | 0.88 | 38.93 | 39.81 | 99.6 | B |
| Comparative Example 4 | Polymer 7 | B | 0.01 | 38.98 | 38.99 | 97.4 | B |
| Comparative Example 5 | Polymer 8 | B | 0.80 | 38.97 | 39.77 | 95.9 | B |

As illustrated in Table 2, the ink compositions containing a charge transport polymer having a substituent (CA) including a substituent having an alicyclic structure of 7 or more carbon atoms bonded directly to a carbonyl-containing group (Examples 1 to 3) exhibited favorable wettability of the ITO substrate and excellent film formability.

Further, in each case, because the surface free energy (sum) of the organic film was at least 42 mJ/m$^2$ and the non-polar component was at least 41 mJ/m$^2$, the wettability by the upper layer ink was able to be improved. Moreover, because the residual film ratio of the organic film obtained from the ink composition was high, the organic film exhibited excellent solvent resistance, making multilayering by wet processes simpler. When an ink for a hole transport layer was actually applied to the organic film to form an upper layer, multilayering was able to be performed favorably, and as shown in Table 2, an excellent film formability result was obtained.

In contrast, in the charge transport polymers that did not have a combination of a substituent having an alicyclic structure of 7 or more carbon atoms and a substituent having a carbonyl-containing group (Comparative Examples 1 to 5), improving both the wettability of the ITO substrate and the wettability by the upper layer ink proved problematic. Moreover specifically, in Comparative Examples 1 to 3, although the film formability on the ITO substrate was favorable, the surface free energy (sum) of the obtained organic film was less than 42 mJ/m$^2$ in each case, and the film formability result for the upper layer was poor. Further, in Comparative Examples 4 and 5, the results for the film formability on the lower layer ITO substrate and the film formability of the upper layer were both inferior.

The effects of embodiments of the present invention have been demonstrated above using a series of examples. However, the present invention is not limited to the charge transport polymers used in the above examples, and provided the scope of the present invention is not exceeded, charge transport materials having excellent characteristics similar to those of the above examples can be provided even in those cases where other charge transport polymers are used.

DESCRIPTION OF THE REFERENCE SIGNS

1: Light-emitting layer
2: Anode
3: Hole injection layer
4: Cathode
5: Electron injection layer
6: Hole transport layer
7: Electron transport layer
8: Substrate

The invention claimed is:

1. A charge transport material comprising a charge transport polymer, wherein the charge transport polymer satisfies at least one of (I) or (II) described below:
   (I) to independently have both a monovalent substituent having an alicyclic structure of 7 or more carbon atoms, and a monovalent substituent having a carbonyl-containing group;
   (II) to have a monovalent substituent comprising a monovalent substituent having an alicyclic structure of 7 or more carbon atoms bonded directly to a carbonyl-containing group.

2. The charge transport material according to claim 1, wherein in (I) and (II), each of the monovalent substituents exists on at least one terminal of the charge transport polymer.

3. The charge transport material according to claim 1, wherein in (I) and (II), each of the monovalent substituents having an alicyclic structure of 7 or more carbon atoms is a cycloalkyl group of 7 to 20 carbon atoms.

4. The charge transport material according to claim 1, wherein in (I) and (II), each of the carbonyl-containing groups contains at least one type of divalent linking group represented by any of formulas (a) to (i) shown below:

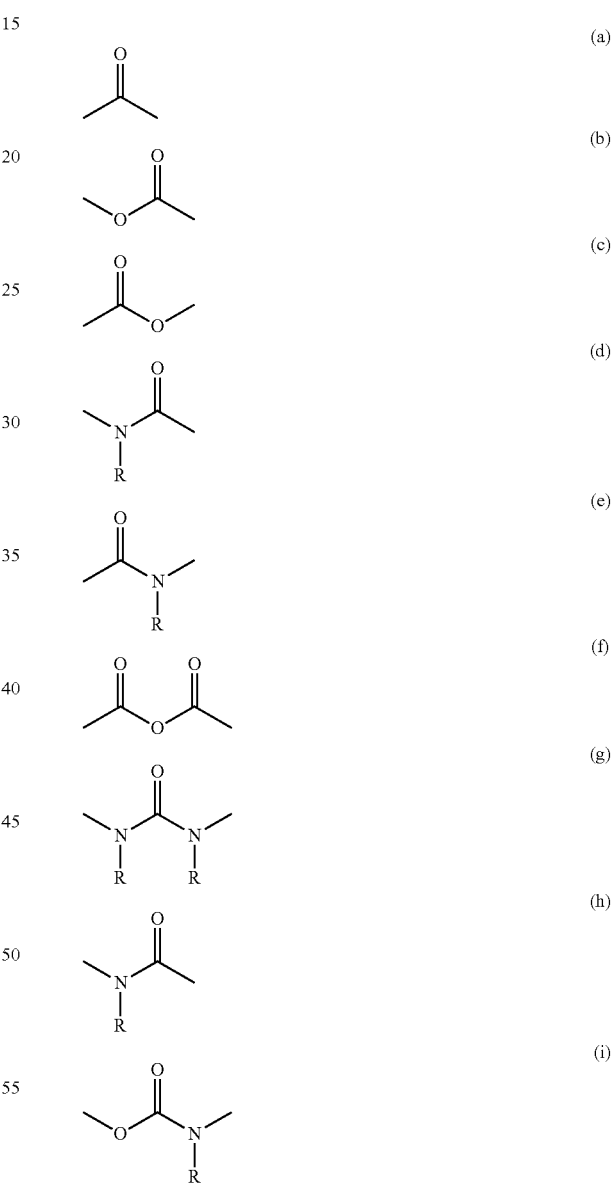

wherein R represents a hydrogen atom or an alkyl group of 1 to 12 carbon atoms (but excludes cyclic alkyl groups of 7 or more carbon atoms).

5. The charge transport material according to claim 1, wherein the charge transport polymer satisfies (II).

6. The charge transport material according to claim 1, wherein the charge transport polymer comprises a divalent structural unit having charge transport properties and a trivalent or higher valent structural unit having charge transport properties.

7. The charge transport material according to claim 1, wherein the charge transport polymer has a structural unit containing at least one type of structure selected from the group consisting of aromatic amine structures, carbazole structures, thiophene structures, fluorene structures, benzene structures and pyrrole structures.

8. The charge transport material according to claim 1, wherein the charge transport polymer has at least one polymerizable functional group.

9. The charge transport material according to claim 1, wherein the charge transport material is used as a hole injection layer material.

10. An ink composition comprising the charge transport material according to claim 1 and a solvent.

11. An organic electronic element having an organic film formed using the charge transport material according to claim 1.

12. An organic electroluminescent element having an organic film formed using the charge transport material according to claim 1.

13. The organic electroluminescent element according to claim 12, also having a flexible substrate.

14. The organic electroluminescent element according to claim 13, wherein the flexible substrate comprises a resin film.

15. A display element comprising the organic electroluminescent element according to claim 12.

16. An illumination device comprising the organic electroluminescent element according to claim 12.

17. A display device comprising the illumination device according to claim 16, and a liquid crystal element as a display unit.

* * * * *